(12) United States Patent
Zhao

(10) Patent No.: US 12,133,445 B2
(45) Date of Patent: Oct. 29, 2024

(54) ARRAY SUBSTRATE, FABRICATION METHOD THEREFOR AND DISPLAY DEVICE

(71) Applicant: BOE Technology Group Co., Ltd., Beijing (CN)

(72) Inventor: Meng Zhao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 396 days.

(21) Appl. No.: 17/764,512

(22) PCT Filed: May 14, 2021

(86) PCT No.: PCT/CN2021/093900
§ 371 (c)(1),
(2) Date: Mar. 28, 2022

(87) PCT Pub. No.: WO2021/249117
PCT Pub. Date: Dec. 16, 2021

(65) Prior Publication Data
US 2022/0406858 A1  Dec. 22, 2022

(30) Foreign Application Priority Data
Jun. 11, 2020  (CN) .......................... 202010529286.8

(51) Int. Cl.
*H01L 27/32* (2006.01)
*G06V 40/13* (2022.01)
(Continued)

(52) U.S. Cl.
CPC .......... *H10K 59/65* (2023.02); *G06V 40/1306* (2022.01); *H10K 59/122* (2023.02);
(Continued)

(58) Field of Classification Search
CPC ...... H10K 59/65; H10K 59/122; H10K 71/00; H10K 71/233; H10K 59/1201;
(Continued)

(56) References Cited

U.S. PATENT DOCUMENTS 10,468,464 B2  11/2019  Yang et al.
2018/0019288 A1  1/2018  Yang et al.
(Continued)

FOREIGN PATENT DOCUMENTS

CN  103887324 A  6/2014
CN  106654067 A  5/2017
(Continued)

OTHER PUBLICATIONS

International Search Report issued in PCT/CN2021/093900 dated Jul. 26, 2021 with English translation, (4p).
(Continued)

*Primary Examiner* — Mohammed R Alam
(74) *Attorney, Agent, or Firm* — Arch & Lake LLP

(57) ABSTRACT

A method for fabricating an array substrate, comprising: providing a base substrate; forming a driving-circuit layer, which comprises first driving circuits and second driving circuits; forming a first electrode layer, which comprises transferring electrodes electrically connected to the first driving circuits, and pixel electrodes electrically connected to the second driving-circuits; forming a pixel-defining layer, which is provided with pixel openings and connecting via holes; forming a first pattern-defining layer, which covers the connecting via holes and exposes the pixel openings; forming an organic light-emitting-material layer, which covers the pixel openings and the first pattern-defining layer; removing the first pattern-defining layer, such that the organic light-emitting-material layer forms an organic light-emitting layer; forming a second pattern-de-
(Continued)

fining layer surrounding the connecting via holes; and forming a second electrode layer, which comprises a common electrode and fingerprint-recognition electrodes isolated by the second pattern-defining layer.

11 Claims, 23 Drawing Sheets

(51) Int. Cl.
  *H10K 59/122* (2023.01)
  *H10K 59/65* (2023.01)
  *H10K 71/00* (2023.01)
  *H10K 71/20* (2023.01)
  *H10K 59/12* (2023.01)

(52) U.S. Cl.
  CPC ........... *H10K 71/00* (2023.02); *H10K 71/233* (2023.02); *H10K 59/1201* (2023.02)

(58) Field of Classification Search
  CPC .. H10K 59/805; H10K 71/621; H10K 50/805; H10K 59/40; H10K 59/12; G06V 40/1306; H01L 27/1214
  See application file for complete search history.

(56) References Cited

U.S. PATENT DOCUMENTS

| 2019/0294849 A1* | 9/2019 | Ma | G06V 40/1318 |
| 2021/0335915 A1* | 10/2021 | Qin | H10K 50/844 |

FOREIGN PATENT DOCUMENTS

| CN | 108376686 A | 8/2018 |
| CN | 111640773 A | 9/2020 |
| WO | 2018129970 A1 | 7/2018 |
| WO | 2019165835 A1 | 9/2019 |

OTHER PUBLICATIONS

Written Opinion of the International Searching Authority in Application No. PCT/CN2021/093900, dated Jul. 26, 2021, with English translation,(4p).

CNOA of Application No. 202010529286.8 dated on Aug. 27, 2022 with English translation,(12p).

* cited by examiner

ARRAY SUBSTRATE, FABRICATION METHOD THEREFOR AND DISPLAY DEVICE

CROSS REFERENCE TO RELATED APPLICATION

The present disclosure is a § 371 national phase application based on International Application No. PCT/CN2021/093900, filed on May 14, 2021, which claims the priority of a Chinese patent application with application number 202010529286.8 and titled "ARRAY SUBSTRATE, PREPARATION METHOD THEREFOR AND DISPLAY DEVICE" filed on Jun. 11, 2020, the entire contents of which are incorporated herein by reference in their entirety.

TECHNICAL FIELD

The present disclosure relates to the field of display technology, and in particular, to an array substrate and a fabricating method and a display device thereof.

BACKGROUND

A self-capacitive finger-print sensor has characteristics of high precision and good anti-noise performance. When finger touches a fingerprint-recognition area, ridges and valleys of a fingerprint form different capacitance values with fingerprint-recognition sensors, respectively. By detecting detection signals of the respective fingerprint-recognition sensors, a pattern of the fingerprint can be combined. OLED display panels (organic electroluminescent display panel) have common electrode layers, which makes it difficult to embed the self-capacitance fingerprint-recognition sensor into the OLED display panel.

The above information disclosed in the background is only for enhancement of understanding of the background of the disclosure, and therefore it may contain information that does not form the prior art that is already known to a person of ordinary skill in the art.

SUMMARY

The purpose of the present disclosure is to provide an array substrate, a fabricating method thereof, and a display device, such that self-capacitive fingerprint-recognition sensors are embedded in an OLED display panel.

To achieve the above-mentioned purpose of the disclosure, the present disclosure adopts the following technical solutions:

According to a first aspect of the present disclosure, there is provided a method for fabricating an array substrate, including:

providing a base substrate;

forming a driving-circuit layer on a side of the base substrate, wherein the driving-circuit layer includes first driving circuits and second driving circuits;

forming a first electrode layer on a side of the driving-circuit layer distal to the base substrate, wherein the first electrode layer includes transferring electrodes electrically connected to the first driving circuits, and pixel electrodes electrically connected to the second driving-circuits;

forming a pixel-defining layer on a side of the first electrode layer distal to the base substrate, wherein the pixel-defining layer is provided with pixel openings and connecting via holes, the pixel opening exposes at least a part of the pixel electrode, and the connecting via hole exposes at least a part of the transferring electrode;

forming a first pattern-defining layer on a side of the pixel-defining layer distal to the base substrate, wherein the first pattern-defining layer covers the connecting via holes and exposes the pixel openings;

forming an organic light-emitting-material layer on a side of the first pattern-defining layer distal to the base substrate, wherein the organic light-emitting-material layer covers the pixel openings and the first pattern-defining layer;

removing the first pattern-defining layer, such that the organic light-emitting-material layer forms an organic light-emitting layer;

forming a second pattern-defining layer surrounding the connecting via holes on the side of the pixel-defining layer distal to the base substrate; and forming a second electrode layer on a side of the second pattern-defining layer distal to the base substrate, wherein the second electrode layer includes a common electrode and fingerprint-recognition electrodes isolated by the second pattern-defining layer.

In an exemplary embodiment of the present disclosure, forming the first pattern-defining layer on the side of the pixel-defining layer distal to the base substrate includes:

forming a first removable base-material layer on the side of the pixel-defining layer distal to the base substrate;

forming a first photoresist-material layer on a side of the first removable base-material layer distal to the base substrate;

patterning the first photoresist-material layer, to form a first mask layer, wherein orthographic projections of the connecting via holes on the first mask layer are located within the first mask layer; and by using the first mask layer as a mask, patterning the first removable base-material layer, to form a first removable base layer, wherein the first removable base layer and the first mask layer constitute the first pattern-defining layer.

In an exemplary embodiment of the present disclosure, forming the first removable base-material layer on the side of the pixel-defining layer distal to the base substrate includes:

by using a first base material, forming the first removable base-material layer on the side of the pixel-defining layer distal to the base substrate, wherein the first base material includes a first fluorinated high-molecular material; and patterning the first removable base-material layer to form the first removable base layer includes:

patterning the first removable base-material layer by using a first stripping solution, to remove a part of the first removable base-material layer not covered by the first mask layer, wherein the first stripping solution contains a first fluorinated solvent.

In an exemplary embodiment of the present disclosure, patterning the first removable base-material layer to form the first removable base layer further includes:

in response to patterning the first removable base-material layer by using the first stripping solution, removing a part of the first removable base-material layer covered by the first mask layer.

In an exemplary embodiment of the present disclosure, removing the first pattern-defining layer includes:

removing the first removable base layer by using a second stripping solution, to remove the first mask layer, wherein the second stripping solution includes a second fluorinated solvent.

In an exemplary embodiment of the present disclosure, forming the second pattern-defining layer surrounding the connecting via holes on the side of the pixel-defining layer distal to the base substrate includes:

forming a second removable base-material layer on a side of the organic light-emitting layer distal to the base substrate;

forming a second photoresist-material layer on a side of the second removable base-material layer distal to the base substrate;

patterning the second photoresist-material layer, to form a second mask layer, wherein an orthographic projection of the second mask layer on the pixel-defining layer surrounds the connecting via holes; and by using the second mask layer as a mask, patterning the second removable base-material layer, to form a second removable base layer, wherein the second removable base layer and the second mask layer constitute the second pattern-defining layer.

In an exemplary embodiment of the present disclosure, forming the second removable base-material layer on the side of the organic light-emitting layer distal to the base substrate includes:

by using a second base material, forming the second removable base-material layer on the side of the organic light-emitting layer distal to the base substrate, wherein the second base material includes a second fluorinated high-molecular material; and patterning the second removable base-material layer to form the second removable base layer includes:

patterning the second removable base-material layer by using a third stripping solution, to remove a part of the second removable base-material layer not covered by the second mask layer, wherein the third stripping solution contains a third fluorinated solvent.

In an exemplary embodiment of the present disclosure, patterning the second removable base-material layer to form the second removable base layer further includes:

in response to patterning the second removable base-material layer by using the third stripping solution, removing a part of the second removable base-material layer covered by the second mask layer.

In an exemplary embodiment of the present disclosure, the method for fabricating the array substrate further includes:

removing the second pattern-defining layer.

According to a second aspect of the present disclosure, there is provided an array substrate, and the array substrate includes:

a base substrate;

a driving-circuit layer, disposed on a side of the base substrate, and including first driving circuits and second driving circuits;

a first electrode layer, disposed on a side of the driving-circuit layer distal to the base substrate, and including transferring electrodes electrically connected to the first driving circuits, and pixel electrodes electrically connected to the second driving-circuits;

a pixel-defining layer, disposed on a side of the first electrode layer distal to the base substrate, wherein the pixel-defining layer is provided with pixel windows and connecting via holes, the pixel opening exposes at least a part of the pixel electrode, and the connecting via hole exposes at least a part of the transferring electrode;

an organic light-emitting layer, disposed on a side of the pixel-defining layer distal to the base substrate, wherein the organic light-emitting layer covers a part of the pixel electrodes exposed by the pixel-defining layer, and exposes the connecting via holes; and a second electrode layer, disposed on a side of the organic light-emitting layer distal to the base substrate, and including a common electrode and fingerprint-recognition electrodes that are insulated from each other, wherein an orthographic projection of the common electrode on the first electrode layer covers a part of the pixel electrodes exposed by the pixel-defining layer, and the fingerprint-recognition electrodes cover the connecting via holes.

According to a third aspect of the present disclosure, there is provided a display device including the above-mentioned array substrate.

According to the fabricating method of array substrate provided by the present disclosure, the transferring electrodes disposed on the same layer as the pixel electrodes can be formed, then the transferring electrodes are protected by the first pattern-defining layer, then the organic light-emitting-material layer is formed, and then the organic light-emitting material on the first pattern-defining layer is removed and the transferring electrodes are re-exposed by removing the first pattern-defining layer. Then, the second pattern-defining layer is formed, and then the second electrode layer is formed, and the second electrode layer is divided into the common electrode and the fingerprint-recognition electrodes by using the second pattern-defining layer, In this way, according to the fabricating method of array substrate and the array substrate provided by the present disclosure, patterning the second electrode layer can be realized to obtain the embedded self-capacitance array substrate, which overcomes the deficiency that an OLED display panel cannot realize self-capacitive fingerprint recognition.

BRIEF DESCRIPTION OF THE DRAWINGS

The above and other features and advantages of the present disclosure will become more apparent from the detailed description of example embodiments thereof with reference to the accompanying drawings.

Figure 1:
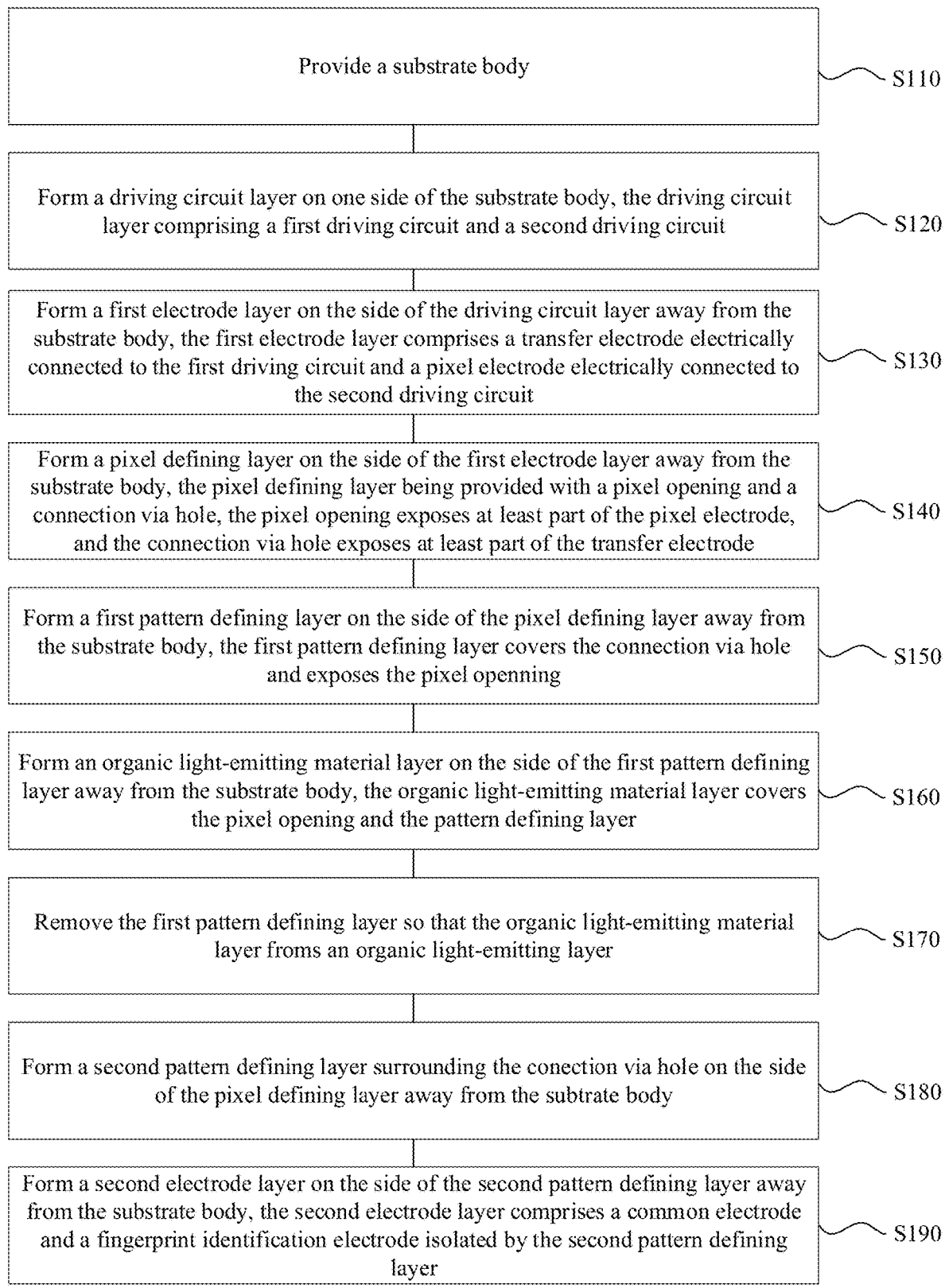
FIG. 1 is a schematic flowchart of a method for fabricating an array substrate according to an embodiment of the present disclosure.

Reference signs of main elements in the drawings are listed as follows:

100, base substrate; 200, driving-circuit layer; 201, active layer; 202, gate-insulating layer; 203, gate layer; 204, interlayer-dielectric layer; 205, source-drain-metal layer; 206, planarization layer; 210, first driving circuit; 211, switching transistor; 212, first scan lead; 213, fingerprint-recognition lead; 220, second driving circuit; 300, first electrode layer; 310, transferring electrode; 311, transferring sub-electrode; 320, pixel electrode; 400, pixel-defining layer; 410, connecting via hole; 420, pixel opening; 500, organic light-emitting layer; 5010, organic light-emitting-material layer; 600, second electrode layer; 610, fingerprint-recognition electrode; 620, common electrode; 630, annular window; 6010, second electrode-material layer; 6011, sacrificial electrode; 700, thin-film-encapsulation layer; 810, first pattern-defining layer; 811, first removable base-material layer; 812, first photoresist-material layer; 813, first mask layer; 814, first removable base layer; 820, second pattern-defining layer; 821, second removable base-material layer; 822, second photoresist-material layer; 823, second mask layer; 824, second removable base layer; A, fingerprint-recognition sensor; B, organic electroluminescence device.

DETAILED DESCRIPTION

Example embodiments will now be described more fully with reference to the accompanying drawings. Example embodiments, however, can be embodied in various forms and should not be construed as limited to the examples set forth herein; rather, these embodiments are provided so that this disclosure will be thorough and complete, and will fully convey the concept of example embodiments to those skilled in the art. The described features, structures, or features may be combined in any suitable manner in one or more embodiments. In the following description, numerous specific details are provided in order to give a thorough understanding of the embodiments of the present disclosure.

In the drawings, the thickness of regions and layers may be exaggerated for clarity. The same reference signs in the drawings denote the same or similar structures, and thus their detailed descriptions will be omitted.

The described features, structures, or features may be combined in any suitable manner in one or more embodiments. In the following description, numerous specific details are provided in order to give a thorough understanding of the embodiments of the present disclosure. However, one skilled in the art will appreciate that the technical solutions of the present disclosure may be practiced without one or more of the specific details, or other methods, components, materials, etc., may be employed. In other instances, well-known structures, materials, or operations are not shown or described in detail to avoid obscuring the main technical idea of the present disclosure.

When a certain structure is "on" other structures, it may mean that the said certain structure is integrally formed on the said other structures, or that the said certain structure is "directly" arranged on the said other structures, or that the said certain structure is "indirectly" arranged on the said other structure through another structure.

The terms "one", "an", "the" are used to indicate the presence of one or more elements/components/etc.; and the terms "include" and "have" are used to indicate an open-ended inclusive meaning and refer to additional elements/components/etc., may be present in addition to listed elements/components/etc. The terms "first" and "second" etc., are used only as labels and not as limitations on a number of objects.

Figure 2:
FIG. 2 is a schematic structural diagram of providing a base substrate according to an embodiment of the present disclosure.

The present disclosure provides a method for fabricating an array substrate. As shown in FIG. 1, the fabricating method of array substrate includes:

In step S110, as shown in FIG. 2, a base substrate 100 is provided.

Figure 3:
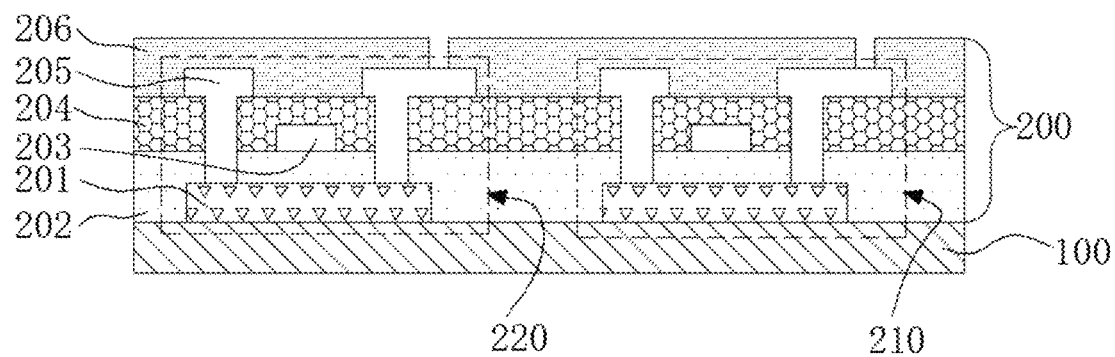
FIG. 3 is a schematic structural diagram of forming a driving-circuit layer according to an embodiment of the present disclosure.

In step S120, as shown in FIG. 3, a driving-circuit layer 200 is formed on one side of the base substrate 100, and the driving-circuit layer 200 includes first driving circuits 210 and second driving circuits 220. In FIG. 3, a transistor is exemplarily used to represent the first driving circuit 210, and another transistor is exemplarily used to represent the second driving circuit 220.

Figure 4:
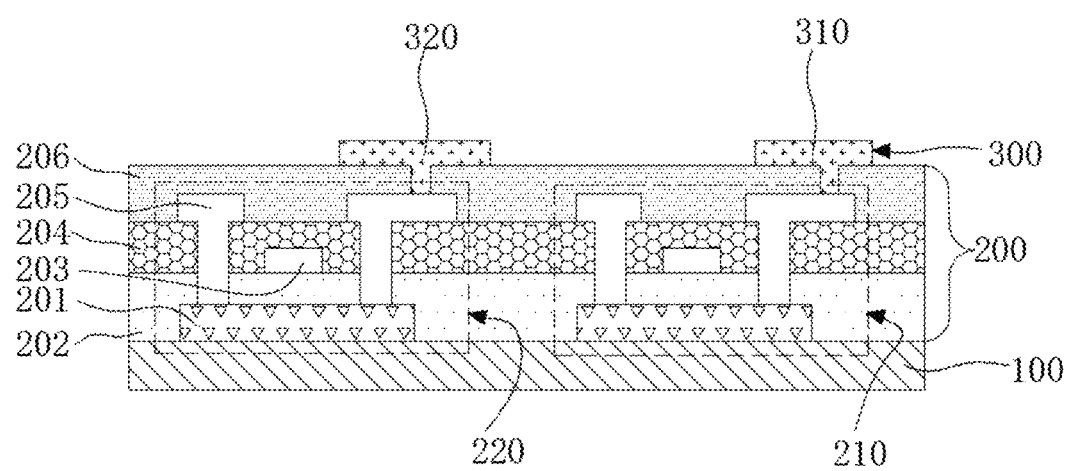
FIG. 4 is a schematic structural diagram of forming a first electrode layer according to an embodiment of the present disclosure.

In step S130, as shown in FIG. 4, a first electrode layer 300 is formed on a side of the driving-circuit layer 200 distal to the base substrate 100. The first electrode layer 300 includes transferring electrodes 310 electrically connected to the first driving circuits 210 and pixel electrodes 320 electrically connected to the second driving circuits 220.

Figure 5:
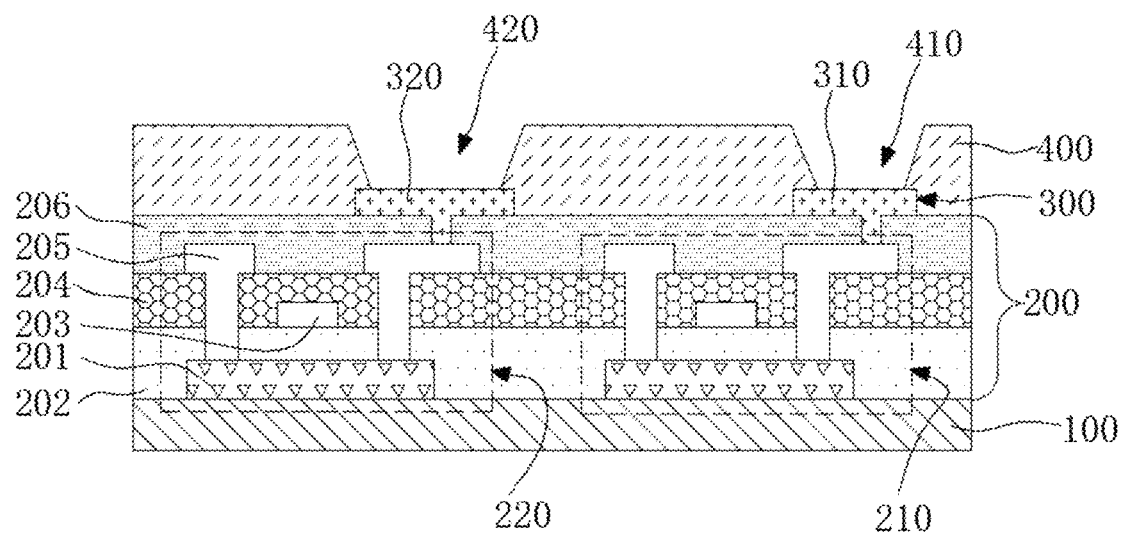
FIG. 5 is a schematic structural diagram of forming a pixel-defining layer according to an embodiment of the present disclosure.

In step S140, as shown in FIG. 5, a pixel-defining layer 400 is formed on a side of the first electrode layer 300 distal to the base substrate 100. The pixel-defining layer 400 is provided with pixel openings 420 and connecting via holes 410. The pixel opening 420 exposes at least a part of the pixel electrode 320, and the connecting via hole 410 exposes at least a part of the transferring electrode 310.

Figure 9:
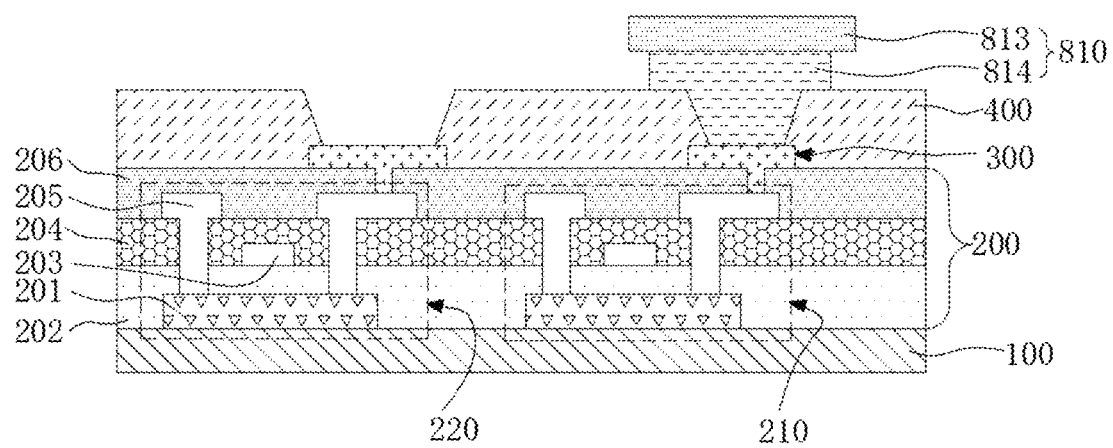
FIG. 9 is a schematic structural diagram of forming a first removable base layer according to an embodiment of the present disclosure.

In step S150, as shown in FIG. 9, a first pattern-defining layer 810 is formed on a side of the pixel-defining layer 400 distal to the base substrate 100, and the first pattern-defining layer 810 covers the connecting via holes 410 and exposes the pixel openings 420.

Figure 10:
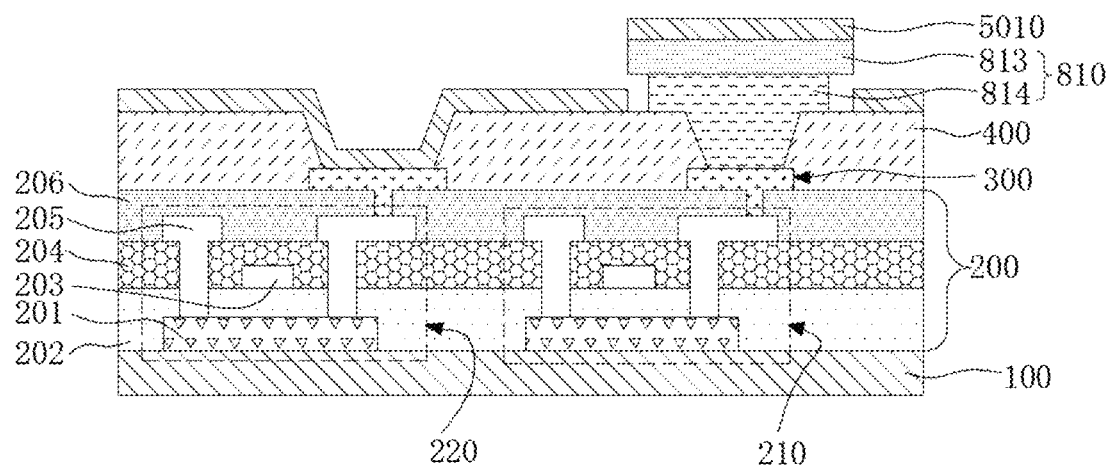
FIG. 10 is a schematic structural diagram of forming an organic light-emitting-material layer according to an embodiment of the present disclosure.

In step S160, as shown in FIG. 10, an organic light-emitting-material layer 5010 is formed on a side of the first pattern-defining layer 810 distal to the base substrate 100, and the organic light-emitting-material layer 5010 covers the pixel openings 420 and the first pattern-defining layer 810.

Figure 11:
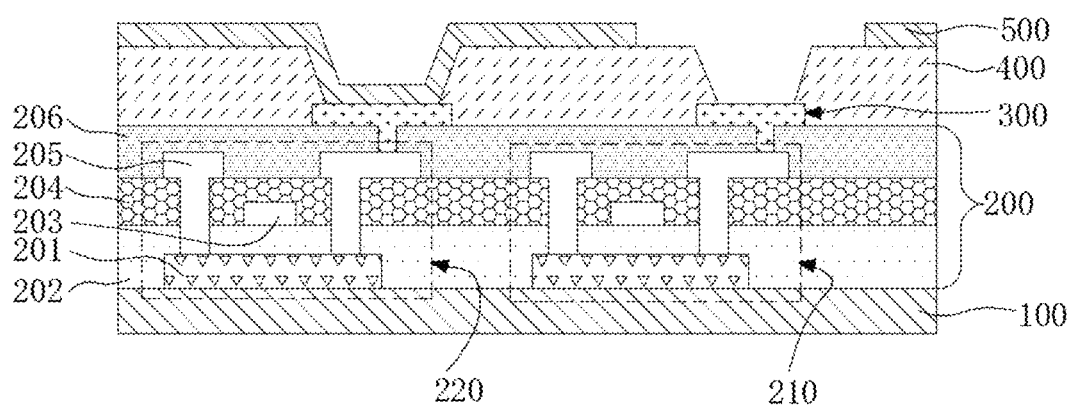
FIG. 11 is a schematic structural diagram of removing the first pattern-defining layer according to an embodiment of the present disclosure.

In step S170, as shown in FIG. 11, the first pattern-defining layer 810 is removed, such that the organic light-emitting-material layer 5010 forms an organic light-emitting layer 500.

Figure 15:
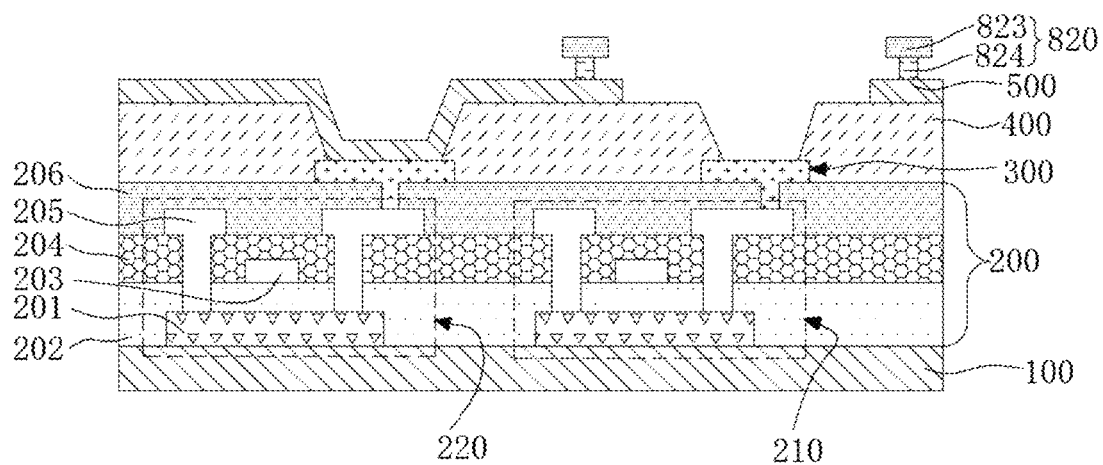
FIG. 15 is a schematic structural diagram of forming a second removable base layer according to an embodiment of the present disclosure.

In step S180, as shown in FIG. 15, a second pattern-defining layer 820 surrounding the connecting via holes 410 is formed on a side of the pixel-defining layer 400 distal to the base substrate 100.

Figure 16:
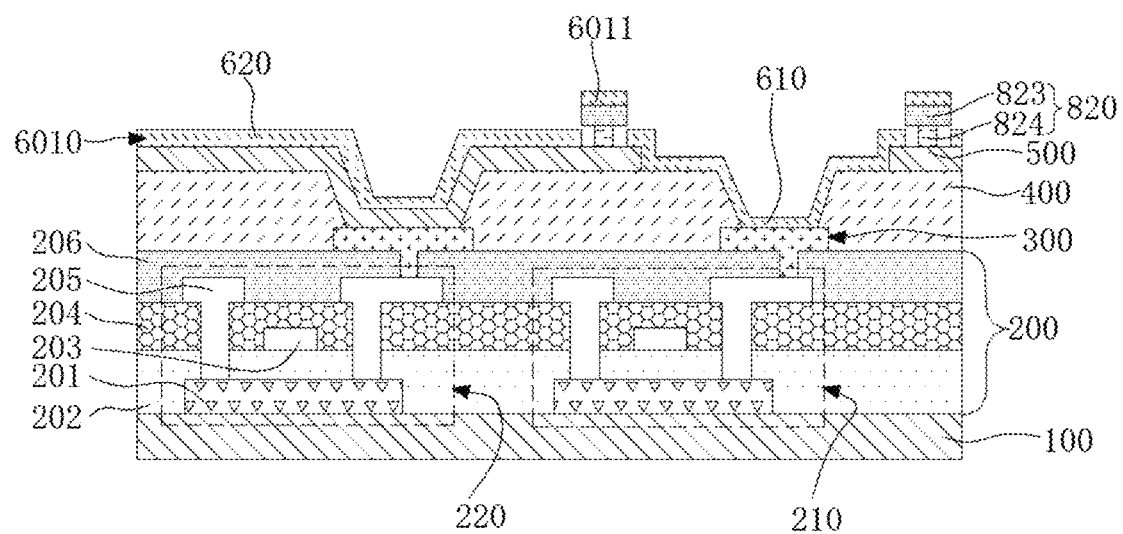
FIG. 16 is a schematic structural diagram of forming a second electrode-material layer according to an embodiment of the present disclosure.

In step S190, as shown in FIG. 16, a second electrode layer 600 is formed on a side of the second pattern-defining layer 820 distal to the base substrate 100. The second electrode layer 600 includes a common electrode 620 and fingerprint-recognition electrodes 610 isolated by the second pattern-defining layer 820.

According to the fabricating method of array substrate provided by the present disclosure, the transferring electrodes 310 disposed on the same layer as the pixel electrodes 320 can be formed, then the transferring electrodes 310 are protected by the first pattern-defining layer 810, then the organic light-emitting-material layer 5010 is formed, and then the organic light-emitting material on the first pattern-defining layer 810 is removed and the transferring electrodes 310 are re-exposed by removing the first pattern-defining layer 810. Then, the second pattern-defining layer 820 is formed, and then the second electrode layer 600 is formed, and the second electrode layer 600 is divided into the common electrode 620 and the fingerprint-recognition electrodes 610 by using the second pattern-defining layer 820, wherein the common electrode 620 and the fingerprint-recognition electrodes 610 are discontinuous from each other. In this way, according to the fabricating method provided by the present disclosure, patterning of the second electrode layer 600 can be realized, thereby obtaining the common electrode 620 and the fingerprint-recognition electrodes 610 arranged on the same layer, to fabricate an embedded self-capacitance array substrate. In this way, the pixel electrodes, the common electrode and the organic light-emitting layer between the pixel electrodes and the common electrode form organic electroluminescent diodes (OLEDs), and the fingerprint-recognition electrodes can be used as self-capacitance fingerprint-recognition sensors, which overcomes the deficiency that an OLED display panel cannot realize self-capacitive fingerprint recognition.

Hereinafter, principles, steps and details of the fabricating method of array substrate provided by the present disclosure will be further explained and described with reference to the accompanying drawings.

In step S110, the base substrate 100 of the array substrate may be provided. The base substrate 100 may be the base substrate of an inorganic material or the base substrate of an organic material. For example, in an embodiment of the present disclosure, material of the base substrate 100 may be glass materials such as soda-lime glass, quartz glass, sapphire glass, etc., or may be metallic materials such as stainless steel, aluminum, nickel, etc. In another embodiment of the present disclosure, the material of the base substrate 100 may be polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), Polyethylene naphthalate (PEN) or a combination thereof. In another embodiment of the present disclosure, the base substrate 100 may be a flexible base substrate as well, for example, the material of the base substrate 100 may be polyimide (PI). The base substrate 100 may be a composite of a plurality of layers of materials as well. For example, in an embodiment of the present disclosure, the base substrate 100 may include a bottom-film layer (Bottom Film), a pressure-sensitive-adhesive layer, a first polyimide layer, and a second polyimide layer that are stacked in sequence.

In step S120, as shown in FIG. 3, a driving-circuit layer 200 may be formed on one side of the base substrate 100, and the driving-circuit layer 200 includes the first driving circuits 210 and the second driving circuits 220.

Figure 17:
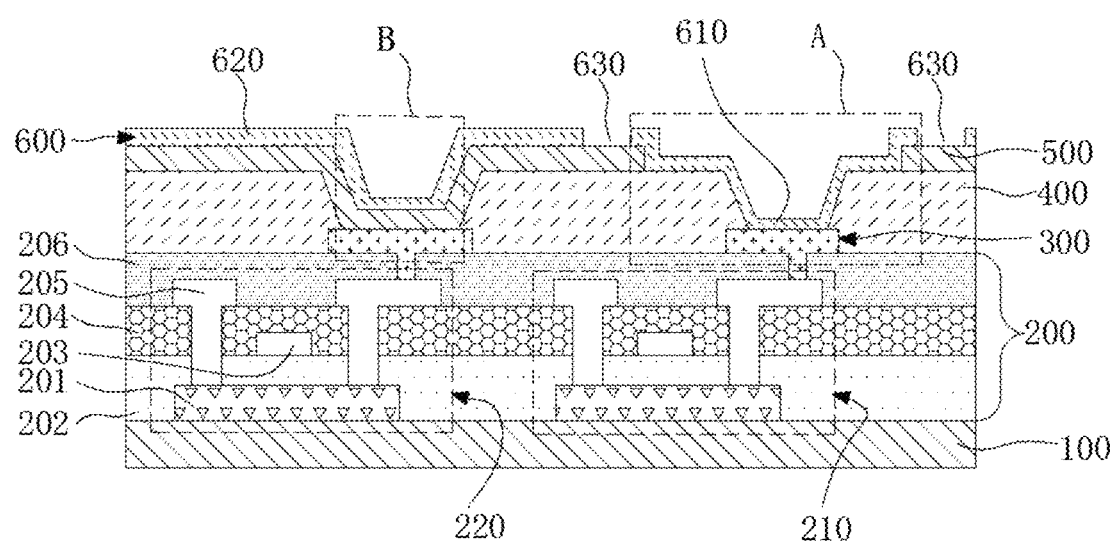
FIG. 17 is a schematic structural diagram of removing the second pattern-defining layer according to an embodiment of the present disclosure.

Optionally, as shown in FIG. 17, the array substrate includes a plurality of first driving-circuits 210 and fingerprint-recognition sensors A connected to the respective first driving-circuits 210 in a one-to-one correspondence, and any one of the fingerprint-recognition sensors A includes the transferring electrode 310 and the fingerprint-recognition electrode 610 connected to the transferring electrode 310. The respective first driving-circuits 210 are used to drive the respective corresponding fingerprint-recognition sensors A in a one-to-one correspondence.

In an embodiment of the present disclosure, the plurality of first driving-circuits 210 and transferring electrodes 310 connected thereto are arranged in an array in a display area of the array substrate, such that the array substrate and a display panel based on the array substrate can realize full-screen fingerprint recognition.

In another embodiment of the present disclosure, the display area of the array substrate has a fingerprint-recognition area, and the plurality of first driving-circuits 210 and transferring electrodes 310 connected thereto are arranged in an array in the fingerprint-recognition area of the array substrate. In this way, the array substrate can realize fingerprint recognition in the fingerprint-recognition area.

In an embodiment of the present disclosure, the first driving circuit 210 is a passive driving circuit, for example, the first driving circuit 210 may be a lead connecting a pad of the array substrate to the transferring electrode 310.

Figure 20:
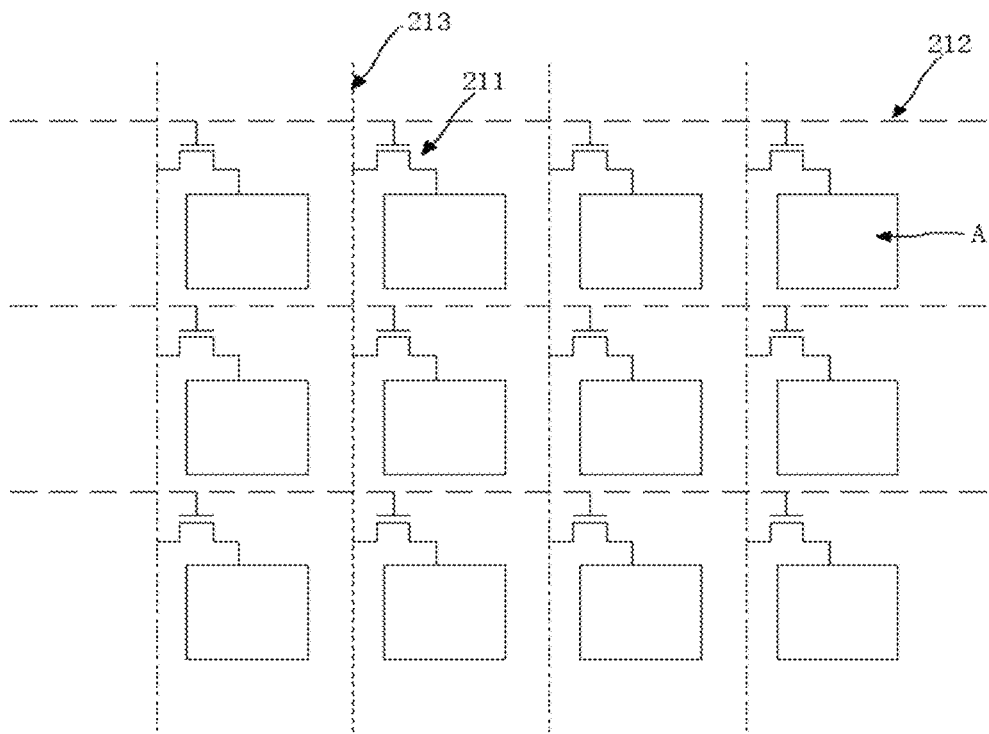
FIG. 20 is an equivalent schematic diagram of a driving circuit of a fingerprint-recognition sensor according to an embodiment of the present disclosure.

In another embodiment of the present disclosure, the first driving circuit 210 may be an active driving-circuit. For example, as shown in FIG. 20, the first driving circuit 210 may include a switch transistor 211, a source electrode of the switch transistor 211 may be connected to a fingerprint-recognition lead 213, a drain electrode of the switch transistor 211 may be connected to the transferring electrode 310 of the array substrate and then connected to the fingerprint-recognition sensor A, and a gate electrode of the switching transistor 211 may be connected to a first scan lead 212 of the array substrate. In this way, when the first scan lead 212 applies an effective scan voltage to the switch transistor 211, the switch transistor 211 is turned on such that it is turned on between the transferring electrode 310 and the pad of the array substrate. Preferably, the switch transistors 211 of the respective first driving circuits 210 are arranged in an array along row and column directions, the gate electrodes of the switch transistors 211 arranged in a same row are connected to a same first scan lead 212, and the source electrodes of the switch transistors 211 arranged in a same column are connected to a same fingerprint-recognition lead 213. In this way, fingerprint-recognition signals of the respective fingerprint-recognition sensors A can be acquired by scanning line by line.

Optionally, as shown in FIG. 17, a number of the second driving-circuits 220 is plural, and the second driving-circuits 220 are arranged in an array in the display area of the array substrate, used to drive organic electroluminescent devices B of the array substrate. Each of the organic electroluminescent devices B includes the pixel electrode 320, the common electrode 620, and the organic light-emitting layer 500 located between the pixel electrode 320 and the common electrode 620.

In an embodiment of the present disclosure, the second driving circuit 220 is a passive driving circuit, for example, the second driving circuit 220 may be a lead connecting the pad of the array substrate to the pixel electrode 320.

In another embodiment of the present disclosure, the first driving circuit 210 may be an active driving-circuit. Exemplarily, the first driving circuit 210 may include a data-writing transistor, a storage capacitor and a driving transistor, a source electrode of the data-writing transistor is connected to a data lead, a gate electrode of the data-writing transistor is connected to the second scan lead, a drain electrode of the data-writing transistor is connected to a first electrode plate of the storage capacitor and a gate electrode of the driving transistor, a second electrode plate of the storage capacitor and a source electrode of the driving transistor are connected to a power-supply lead, and a drain electrode of the driving transistor is connected to the pixel electrode 320. It can be understood that the above-mentioned driving circuit of a 2T1C architecture is only an example of the second driving circuit 220. In other cases, the second driving circuit 220 may be other circuit structures as well, for example, a 5T1C architecture, a 6T1C architecture, a 7T1C architecture, a 4T2C architecture, a 5T2C architecture, etc., may be adopted, which are not described in detail in the present disclosure here.

Optionally, the transistors in the driving-circuit layer 200 may be thin-film transistors. In terms of structure of film layer, the thin-film transistor may be a top-gate thin-film transistor or a bottom-gate thin-film transistor, which is not limited in the present disclosure. In terms of material of thin-film transistor, the thin-film transistor may be a low-temperature-polysilicon thin-film transistor, an oxide thin-film transistor or an organic-semiconductor thin-film transistor, which is not limited in the present disclosure. In terms of conduction condition of thin-film transistor, the thin-film transistor may be an N-type thin-film transistor or a P-type thin-film transistor, which is not limited in the present disclosure.

As shown in FIG. 3, in the driving-circuit layer 200, the respective thin-film transistors may be formed by film layers such as an active layer 201, a gate-insulating layer 202, a gate layer 203, an interlayer-dielectric layer 204, and a source-drain-metal layer 205. The active layer 201 may include channel regions of the thin-film transistors, the gate layer 203 may include gate electrodes of the thin-film transistors, and the source-drain-metal layer 205 may include source and drain electrodes of the thin-film transistors. Positional relationships of the respective film layers may be determined according to the structure of film layer of the thin-film transistors. For example, in an embodiment of the present disclosure, the driving-circuit layer 200 may include the active layer 201, the gate-insulating layer 202, the gate layer 203, the interlayer-dielectric layer 204 and the source-drain-metal layer 205 that are stacked in sequence, and thus formed thin-film transistors are top-gate thin-film transistors. For another example, in another embodiment of the present disclosure, the driving-circuit layer 200 may include the gate layer 203, the gate-insulating layer 202, the active layer 201, the interlayer-dielectric layer 204 and the source-drain-metal layer 205 that are stacked in sequence, and thus formed thin-film transistors are bottom-gate thin-film transistors. The driving-circuit layer 200 may adopt a double-gate structure as well, that is, the gate layer 203 may include a first gate layer 203 and a second gate layer 203, and the gate-insulating layer 202 may include a first gate-insulating layer 202 for isolating the active layer 201 from the first gate layer 203, and a second gate-insulating layer 202 for isolating the first gate layer 203 from the second gate layer 203. For example, in an embodiment of the present disclosure, the driving-circuit layer 200 may include the active layer 201, the first gate-insulating layer 202, the first gate layer 203, the second gate-insulating layer 202, the second gate layer 203, the interlayer-dielectric layer 204, and the source-drain-metal layer 205 that are stacked in sequence on one side of the base substrate 100.

Optionally, as shown in FIG. 3, the driving-circuit layer 200 may further include a planarization layer 206 disposed on a side of the thin-film transistor distal to the base substrate 100, so as to provide a planarized surface for the first electrode layer 300. The planarization layer 206 exposes at least a part of structure of the first driving circuits 210 and at least a part of structure of the second driving circuits 220, such that the first driving circuits 210 may be connected to the transferring electrodes 310, and the second driving circuits 220 may be connected to the pixel electrodes 320.

Preferably, the planarization layer 206 exposes at least a part of region of the drain electrode of the switching transistor 211 of the first driving circuit 210, and exposes at least a part of region of the drain electrode of the driving transistor of the second driving circuit 220.

In step S130, as shown in FIG. 4, the first electrode layer 300 may be formed on the side of the driving-circuit layer 200 distal to the base substrate 100, and the first electrode layer 300 includes the transferring electrodes 310 electrically connected to the first driving circuits 210, and the pixel electrodes 320 electrically connected to the second driving circuits 220.

Preferably, the first electrode layer 300 may be fabricated by the following manner: forming a first electrode-material layer on the side of the driving-circuit layer 200 distal to the base substrate 100, and then patterning the first electrode-material layer to form the transferring electrodes 310 arranged in an array, and the pixel electrodes 320 arranged in an array.

Optionally, the transferring electrode 310 may be located between two adjacent pixel electrodes 320, or may include a plurality of transferring sub-electrodes electrically connected to each other, and the respective transferring sub-electrodes are located between different pixel electrodes 320.

For example, in an embodiment of the present disclosure, the transferring electrode 310 may be located between two adjacent pixels, and one transferring electrode 310 may be connected to one fingerprint-recognition electrode 610 to form one fingerprint-recognition sensor A.

Figure 21:
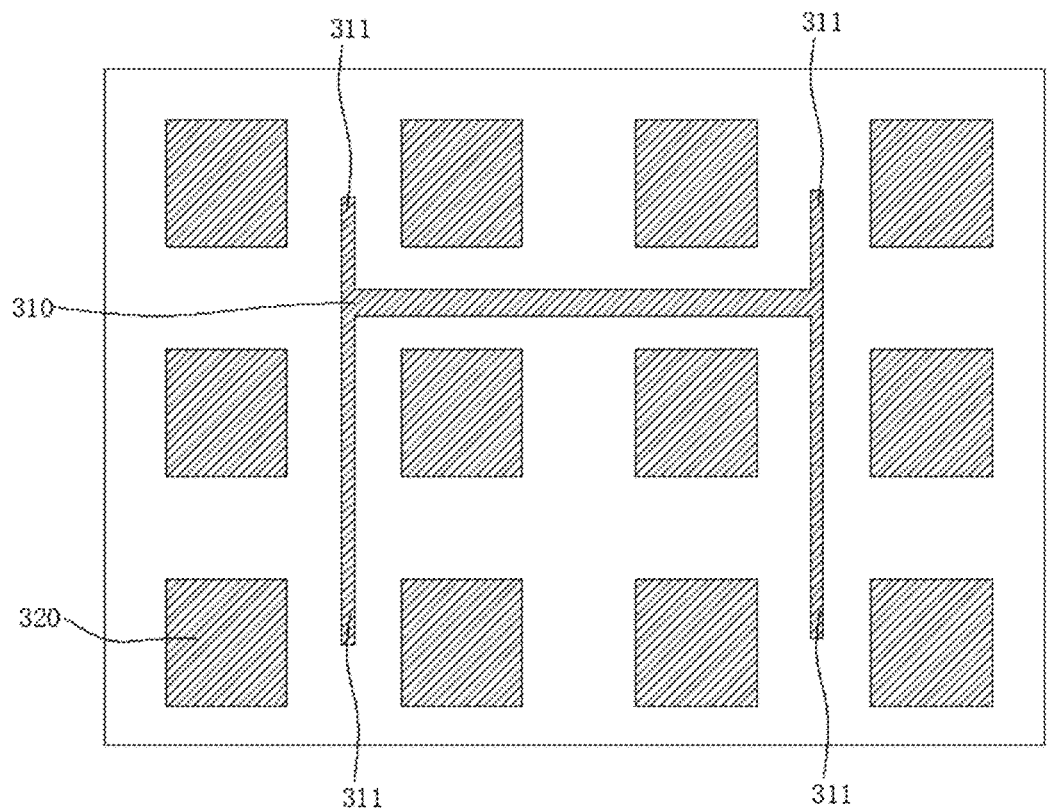
FIG. 21 is a schematic top-view structural diagram of the first electrode layer according to an embodiment of the present disclosure.
Figure 22:
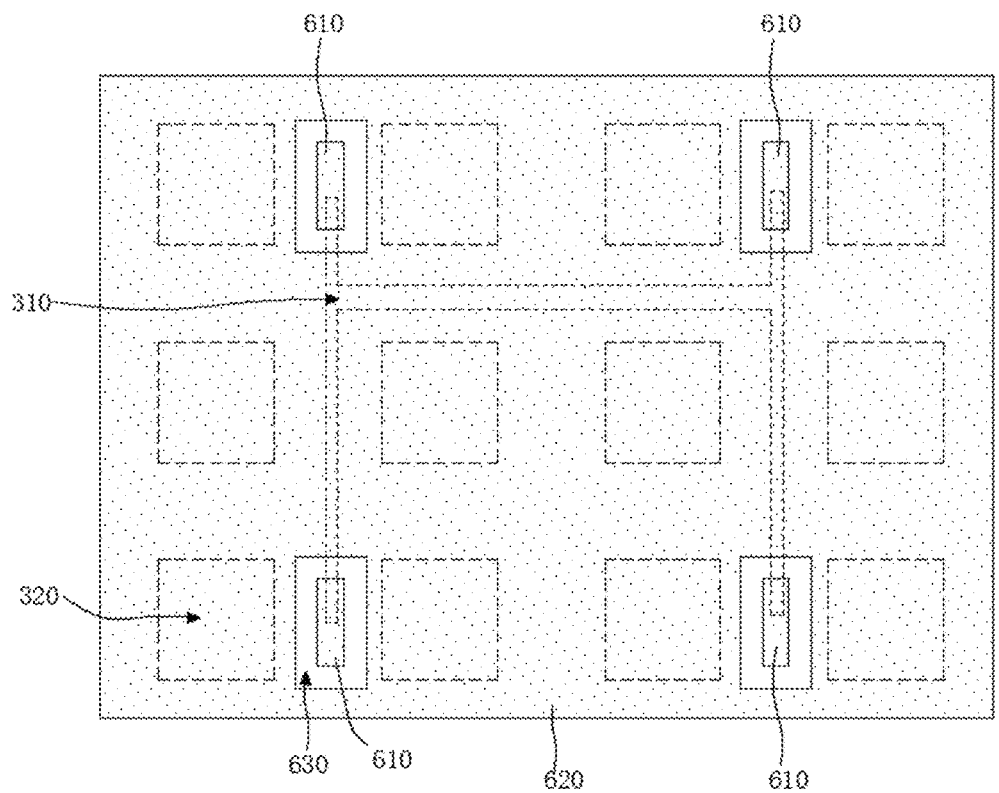
FIG. 22 is a schematic top-view structural diagram of the second electrode layer according to an embodiment of the present disclosure.

For another example, in another embodiment of the present disclosure, as shown in FIG. 21 and FIG. 22, the transferring electrode 310 may include a plurality of transferring sub-electrodes 311, and the respective transferring sub-electrodes 311 are electrically connected to each other and electrically connected to the drain electrode of the switching transistor 211 of the first driving circuit 210 by the same metallized via hole. Different transferring sub-electrodes 311 may be located between different pixel electrodes 320, and each of the transferring sub-electrodes 311 is electrically connected to one fingerprint-recognition electrode 610. In this way, one fingerprint-recognition sensor A includes one transferring electrode 310 and a plurality of fingerprint-recognition electrodes 610 connected to the transferring electrode 310. The respective fingerprint-recognition electrodes 610 are isolated by the common electrode 620 and respectively located between different pixel electrodes 320. Thus, a sensing range of one fingerprint-recognition sensor A includes a plurality of sub-pixel ranges, which can increase a total area of the fingerprint-recognition electrodes 610 in the fingerprint-recognition sensor A, thereby improving accuracy of fingerprint recognition, and preventing the problem that the driver chip cannot recognize the fingerprint-recognition signal due to a too small area of one single fingerprint-recognition electrode 610.

In step S140, as shown in FIG. 5, a pixel-defining layer 400 may be formed on the side of the first electrode layer 300 distal to the base substrate 100. The pixel-defining layer 400 is provided with pixel openings 420 and connecting via holes 410. The pixel opening 420 exposes at least a part of the pixel electrode 320, and the connecting via hole 410 exposes at least a part of the transferring electrode 310.

In an embodiment of the present disclosure, the transferring electrode 310 includes a plurality of transferring sub-electrodes 311, and each of the transferring sub-electrodes 311 may be correspondingly provided with one connecting via hole 410. In other words, the pixel-defining layer 400 may have a plurality of connecting-via-hole groups, and the respective connecting-via-hole groups are provided in a one-to-one correspondence with the respective transferring electrodes 310. One connecting-via-hole group includes a plurality of connecting via holes 410, and one transferring electrode 310 includes a plurality of transferring sub-electrode 311 that are electrically connected to each other. In the correspondingly-provided connecting-via-hole group and transferring electrode 310, the respective connecting via holes 410 are provided in a one-to-one correspondence with the respective transferring sub-electrodes 311, and the connecting via holes 410 expose the correspondingly-provided transferring sub-electrodes 311.

In step S150, a first pattern-defining layer 810 may be formed on the side of the pixel-defining layer 400 distal to the base substrate 100, and the first pattern-defining layer 810 covers the connecting via holes 410 and exposes the pixel openings 420.

Figure 6:
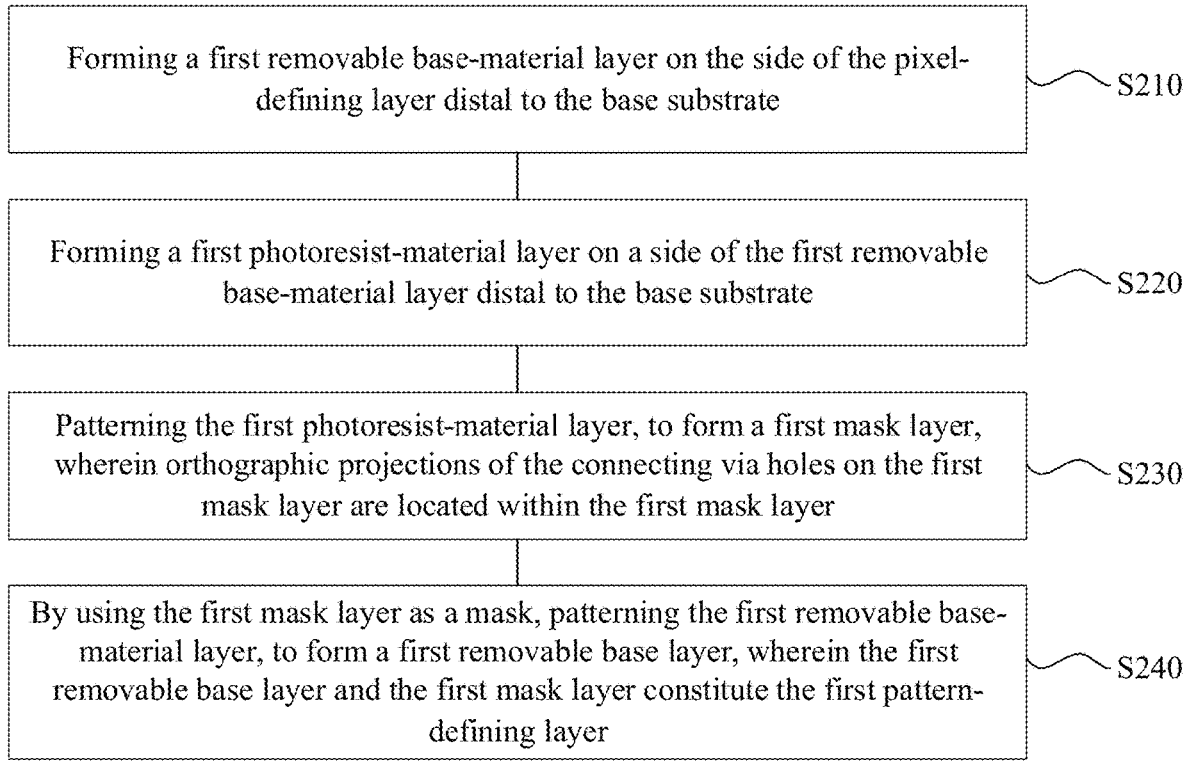
FIG. 6 is a schematic flowchart of forming a first pattern-defining layer according to an embodiment of the present disclosure.
Figure 7:
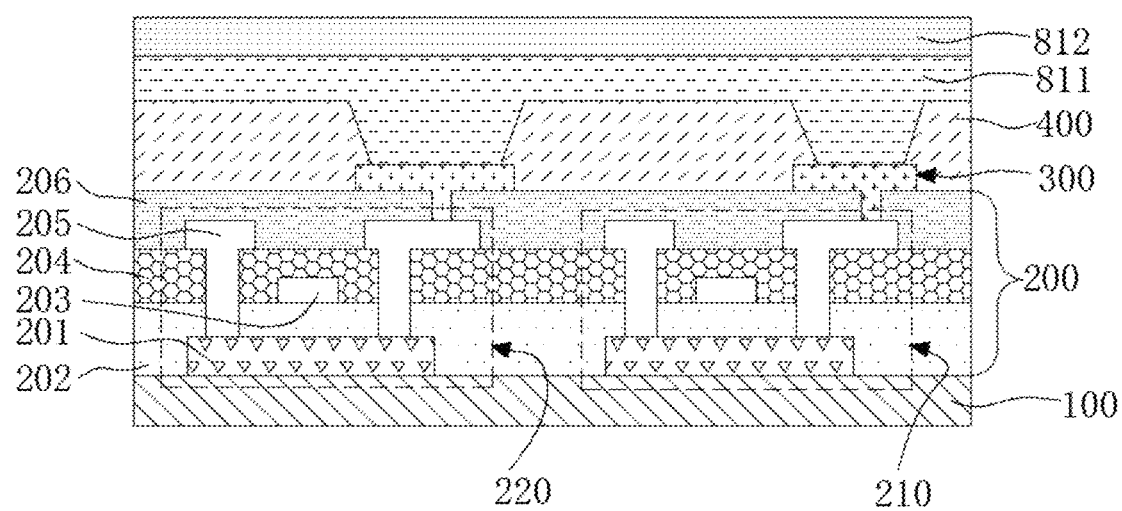
FIG. 7 is a schematic structural diagram of forming a first removable base-material layer and a first photoresist-material layer according to an embodiment of the present disclosure.

Optionally, as shown in FIG. 6, the first pattern-defining layer 810 may be formed by the following manner shown in steps S210 to S240:

In step S210, as shown in FIG. 7, a first removable base-material layer 811 is formed on the side of the pixel-defining layer 400 distal to the base substrate 100.

In step S220, as shown in FIG. 7, a first photoresist-material layer 812 is formed on a side of the first removable base-material layer 811 distal to the base substrate 100.

Figure 8:
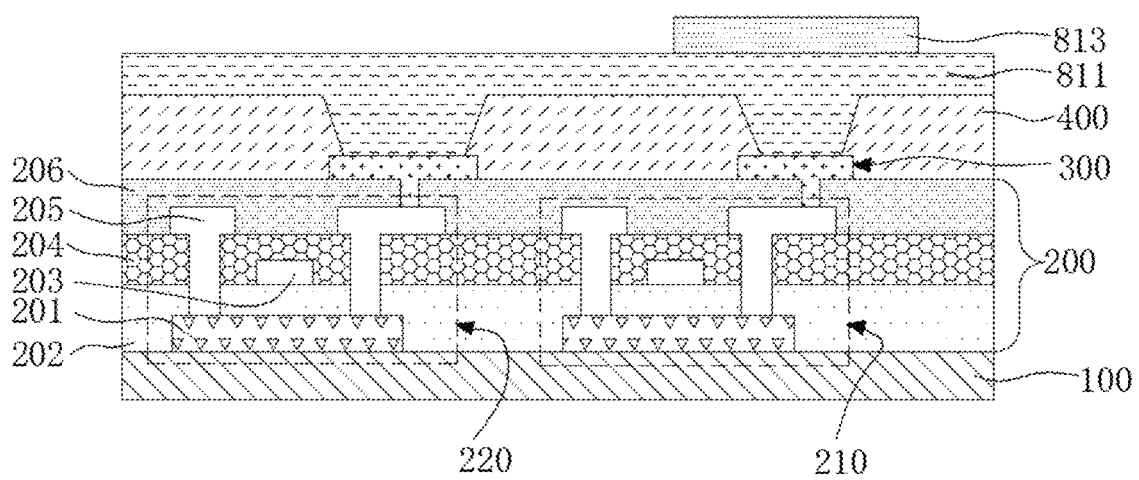
FIG. 8 is a schematic structural diagram of forming a first mask layer according to an embodiment of the present disclosure.

In step S230, as shown in FIG. 8, the first photoresist-material layer 812 is processed by a patterning operation to form a first mask layer 813, and orthographic projections of the connecting via holes 410 on the first mask layer 813 are located within the first mask layer 813.

In step S240, as shown in FIG. 9, by using the first mask layer 813 as a mask, the first removable base-material layer 811 is processed by a patterning operation to form a first removable base layer 814. The first removable base layer 814 and the first mask layer 813 constitute the first pattern-defining layer 810.

In step S210, the first removable base-material layer 811 may be formed by using a material system "orthogonal" to the first photoresist-material layer 812, wherein "orthogonal" refers to patterning manners of the two materials are different and do not influence on each other. In other words, the patterning operation of the first photoresist-material layer 812 will not cause any change of the first removable base-material layer 811, and the patterning operation of the first removable base-material layer 811 will not cause any change of the first mask layer 813. Further optionally, a material system that is "orthogonal" to material of the organic light-emitting-material layer 5010 is adopted to fabricate the first removable base-material layer 811, that is, the removal of the first removable base layer 814 will not cause the organic light-emitting layer 500 to be damaged.

Preferably, in step S210, a first base material may be used to form the first removable base-material layer 811 on the side of the pixel-defining layer 400 distal to the base substrate 100. The first base material includes a first fluorinated high-molecular material, so it will not be corroded or developed by developer of photoresist. In step S240, the first removable base-material layer 811 may be processed by a patterning operation by using a first stripping solution, to remove a part of the first removable base-material layer 811 not covered by the first mask layer 813. The first stripping solution contains a first fluorinated solvent, which does not cause the first mask layer 813 to be corroded or swell.

The first fluorinated solvent may preferably be a hydrofluoroether compound, for example, may be selected from one or more of the following solvents: isomer mixture of methyl nonafluorobutyl ether and methyl nonafluoroisobutyl ether (HFE-7100), isomer mixture of ethyl nonafluorobutyl ether and ethyl nonafluoroisobutyl ether (HFE-7200), 3-ethoxy-1, 1, 1, 2, 3, 4, 4, 5, 5, 6, 6, 6-dodecafluoro-2-trifluoromethyl-hexane (HFE-7500), 1, 1, 1, 2, 3, 3-hexafluoro-4-(1, 1, 2, 3, 3, 3-Hexafluoropropoxy)-pentane (HFE-7600), 1-methoxyheptafluoropropane (HFE-7000), 1, 1, 1, 2, 2, 3, 4, 5, 5, 5-decafluoro-3-methoxy-4-trifluoromethylpentane (HFE-7300), 1, 2-(1, 1, 2, 2-tetrafluoroethoxy) ethyl alkane (HFE-578E), 1, 1, 2, 2-tetrafluoroethyl-1H, 1H, 5H-octafluoropentyl ether (HFE-6512), 1, 1, 2, 2-tetrafluoroethyl-2, 2, 2-trifluoroethyl ether (HFE-347E), 1, 1, 2, 2-tetrafluoroethyl-2, 2, 3, 3-tetrafluoropropyl ether (HFE-458E), 2, 3, 3, 4, 4-pentafluorotetrahydro-5-methoxy-2, 5-bis[1, 2, 2, 2-tetrafluoro-1-(trifluoromethyl)ethyl]-furan (HFE-770), 1, 1, 1, 2, 2, 3, 3, 4, 4, 5, 5, 6, 6-tridecafluorooctane-propyl ether (TE6O—C3), $F(CF_2)_5OCH_3$, $F(CF_2)_6OCH_3$, $F(CF_2)_7OCH_3$, $F(CF_2)_8OCH_2CH_3$, $F(CF_2)_2O(CF_2)_4OCH_2CH_3$, $F(CF_2)_3OCF(CF_3)CF_2OCH_3$, $(CF_3)_2N(CF_2)_3OCH_3$, $(C_3F_7)_2N(CF_2)_3OC_3H_7$.

In one embodiment of the present disclosure, the first stripping solution is composed by the first fluorinated solvent.

In step S240, as shown in FIG. 9, when the first removable base-material layer 811 is processed by a patterning operation by using the first stripping solution, a part of the first removable base-material layer 811 covered by the first mask layer 813 may be further removed. In other words, when the first removable base-material layer 811 is processed by a patterning operation by using the first stripping solution, the first stripping solution can continue to etch the first removable base-material layer 811 protected by the first mask layer 813 along an edge of the first mask layer 813, such that an orthographic projection of the first removable base layer 814 on the first mask layer 813 is within the first mask layer 813. That is, the first pattern-defining layer 810 may be T-shaped, and the edge of the first mask layer 813 may not be supported by the first removable base layer 814. In this way, as shown in FIG. 10, when the organic light-emitting-material layer 5010 is formed, the organic light-emitting-material layer 5010 is discontinuous at edges of the first pattern-defining layer 810, to facilitate exposing and removing the first removable base layer 814, so as to remove the first pattern-defining layer 810 and a part of the organic light-emitting-material layer 5010 located on the first pattern-defining layer 810 by removing the first removable base layer 814, to realize patterning of the organic light-emitting-material layer 5010.

In step S160, as shown in FIG. 10, the organic light-emitting-material layer 5010 may be formed on a side of the first pattern-defining layer 810 distal to the base substrate 100, and the organic light-emitting-material layer 5010 covers the pixel openings 420 and the first pattern-defining layer 810.

Optionally, the organic light-emitting layer 500 may include one or more of the following sub-film layers: a hole injection layer, a hole transport layer, an electron blocking layer, an electroluminescence layer, an electron transport layer, an electron injection layer, etc., and the present disclosure does not make any special restrictions on the structure of film layer of the organic light-emitting layer 500, as long as organic electroluminescence can be realized.

Optionally, some sub-film layers or all of the sub-film layers in the organic light-emitting layer 500 may be fabricated by evaporation, for example, by evaporation using an open mask or a precision metal mask. Certainly, some sub-film layers in the organic light-emitting layer 500 may be fabricated by other manners as well, such as ink jet printing, screen printing, spin coating or other feasible processes, which are not particularly limited in the present disclosure.

In step S170, as shown in FIG. 11, the first pattern-defining layer 810 may be removed, and then the part of the organic light-emitting-material layer 5010 coving the first pattern-defining layer 810 may be removed, to realize patterning of the organic light-emitting-material layer 5010. The left organic light-emitting-material layer 5010 may form the organic light-emitting layer 500 of the array substrate. In this way, the organic light-emitting layer 500 covers the pixel openings 420 and exposes the connecting via holes 410.

Optionally, the first removable base layer 814 may be removed by using a second stripping solution, and then the first mask layer 813 and a part of the organic light-emitting-material layer 5010 covering the first mask layer 813 may be removed. The second stripping solution contains a second fluorinated solvent. The second stripping solution can dissolve the first removable base layer 814 or make the first removable base layer 814 swell, but does not dissolve or corrode the organic light-emitting layer 500, then does not cause the organic light-emitting layer 500 to be damaged while removing the first pattern-defining layer 810, thereby ensuring light-emitting performance of the organic electroluminescent devices B.

The second fluorinated solvent may preferably be a hydrofluoroether compound, for example, may be selected from one or more of the following solvents: isomer mixture of methyl nonafluorobutyl ether and methyl nonafluoroisobutyl ether (HFE-7100), isomer mixture of ethyl nonafluorobutyl ether and ethyl nonafluoroisobutyl ether (HFE-7200), 3-ethoxy-1, 1, 1, 2, 3, 4, 4, 5, 5, 6, 6, 6-dodecafluoro-2-trifluoromethyl-hexane (HFE-7500), 1, 1, 1, 2, 3, 3-hexafluoro-4-(1, 1, 2, 3, 3, 3-Hexafluoropropoxy)-pentane (HFE-7600), 1-methoxyheptafluoropropane (HFE-7000), 1, 1, 1, 2, 2, 3, 4, 5, 5, 5-decafluoro-3-methoxy-4-trifluoromethylpentane (HFE-7300), 1, 2-(1, 1, 2, 2-tetrafluoroethoxy) ethyl alkane (HFE-578E), 1, 1, 2, 2-tetrafluoroethyl-1H, 1H, 5H-octafluoropentyl ether (HFE-6512), 1, 1, 2, 2-tetrafluoroethyl-2, 2, 2-trifluoroethyl ether (HFE-347E), 1, 1, 2, 2-tetrafluoroethyl-2, 2, 3, 3-tetrafluoropropyl ether (HFE-458E), 2, 3, 3, 4, 4-pentafluorotetrahydro-5-methoxy-2, 5-bis[1, 2, 2, 2-tetrafluoro-1-(trifluoromethyl)ethyl]-furan (HFE-770), 1, 1, 1, 2, 2, 3, 3, 4, 4, 5, 5, 6, 6-tridecafluorooctane-propyl ether (TE6O—C3), $F(CF_2)_5OCH_3$, $F(CF_2)_6OCH_3$, $F(CF_2)_7OCH_3$, $F(CF_2)_8OCH_2CH_2CH_3$, $F(CF_2)_2O(CF_2)_4OCH_2CH_3$, $F(CF_2)_3OCF(CF_3)CF_2OCH_3$, $(CF_3)_2N(CF_2)_3OCH_3$, $(C_3F_7)_2N(CF_2)_3OC_3H_7$.

In one embodiment of the present disclosure, the second stripping solution is composed by the second fluorinated solvent.

Figure 23:
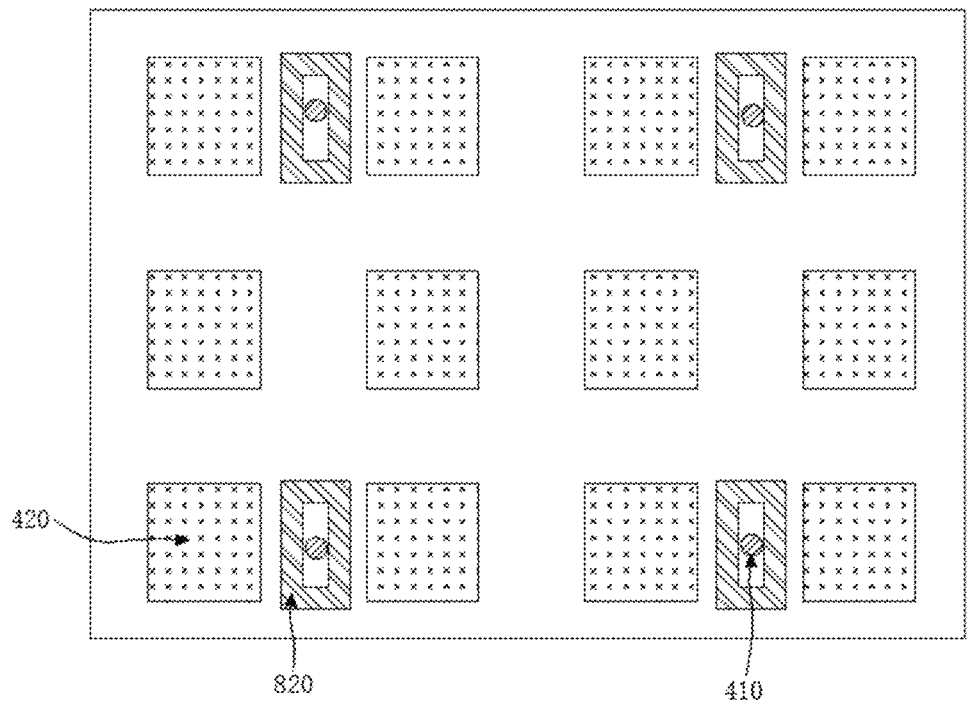
FIG. 23 is a schematic top-view structural diagram of the second pattern-defining layer according to an embodiment of the present disclosure.

In step S180, as shown in FIG. 15 and FIG. 23, a second pattern-defining layer 820 surrounding the connecting via holes 410 is formed on the side of the pixel-defining layer 400 distal to the base substrate 100. The second pattern-defining layer 820 is used for dividing the second electrode layer 600. Preferably, the second pattern-defining layer 820 includes a plurality of annular patterns, any one of the annular patterns surrounds one of the connecting via holes 410, and any one of the annular patterns does not cover any of the connecting via holes 410 or the pixel openings 420. In other words, an orthographic projection of the second pattern-defining layer 820 on the pixel-defining layer 400 surrounds the respective connecting via holes 410 and does not overlap any one of the pixel openings 420.

Figure 12:
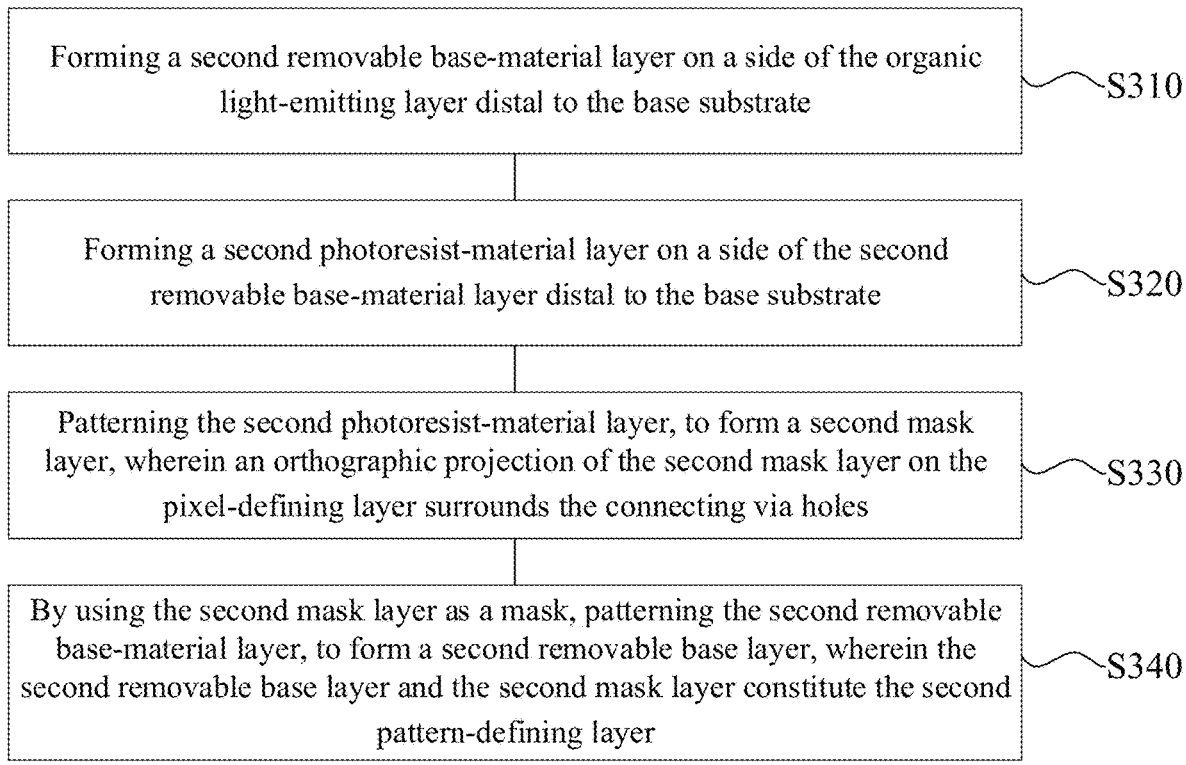
FIG. 12 is a schematic flowchart of forming a second pattern-defining layer according to an embodiment of the present disclosure.
Figure 13:
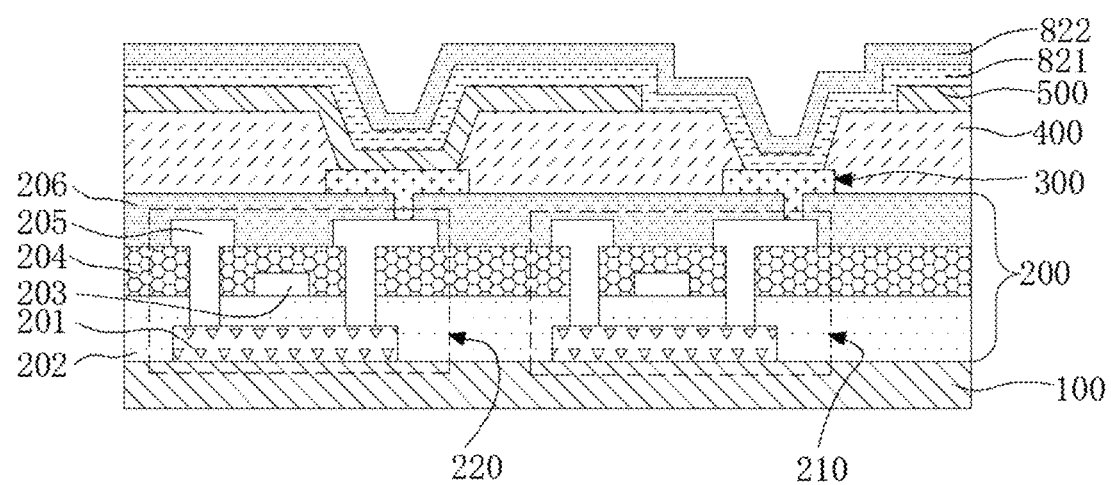
FIG. 13 is a schematic structural diagram of forming a second removable base-material layer and a second photoresist-material layer according to an embodiment of the present disclosure.

Optionally, as shown in FIG. 12, the first pattern-defining layer 810 may be formed by the following manner shown in steps S310 to S340:

In step S310, as shown in FIG. 13, a second removable base-material layer 821 is formed on a side of the organic light-emitting layer 500 distal to the base substrate 100.

In step S320, as shown in FIG. 13, a second photoresist-material layer 822 is formed on a side of the second removable base-material layer 821 distal to the base substrate 100.

Figure 14:
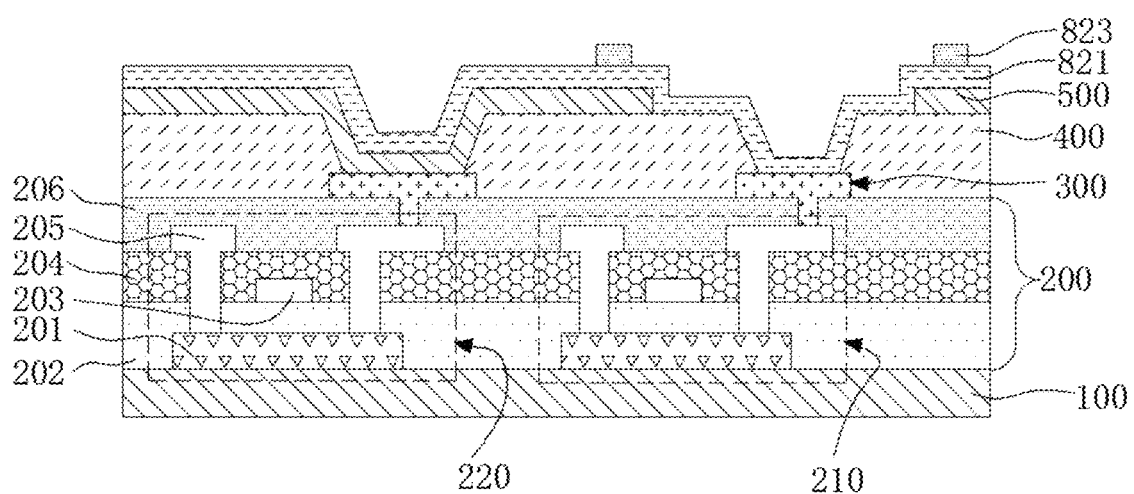
FIG. 14 is a schematic structural diagram of forming a second mask layer according to an embodiment of the present disclosure.

In step S330, as shown in FIG. 14, the second photoresist-material layer 822 is processed by a patterning operation to form a second mask layer 823, and an orthographic projection of the second mask layer 823 on the pixel-defining layer 400 surrounds the connecting via holes 410.

In step S340, by using the second mask layer 823 as a mask, the second removable base-material layer 821 is processed by a patterning operation to form a second removable base layer 824, and the second removable base layer 824 and the second mask layer 823 constitute the second pattern-defining layer 820.

In step S310, the second removable base-material layer 821 may be formed by using a material system "orthogonal" to the second photoresist-material layer 822 and the organic light-emitting layer 500. In other words, the patterning operation of the second photoresist-material layer 822 will not cause any change of the second removable base-material layer 821, and the patterning operation of the second removable base-material layer 821 will not cause any change of the second mask layer 823 and the organic light-emitting layer 500.

Preferably, in step S310, a second base material may be used to form the second removable base-material layer 821 on the side of the organic light-emitting layer 500 distal to the base substrate 100. The second base material includes a second fluorinated high-molecular material, so it will not be corroded or developed by developer of the second photoresist-material layer 822. In step S340, the second removable base-material layer 821 may be processed by a patterning operation by using a third stripping solution, to remove a part of the second removable base-material layer 821 not covered by the second mask layer 823. The third stripping solution contains a third fluorinated solvent, which will not cause the second mask layer 823 to be corroded or swell, nor will it cause the organic light-emitting layer 500 to be corroded or swell.

The third fluorinated solvent may preferably be a hydrofluoroether compound, for example, may be selected from one or more of the following solvents: isomer mixture of methyl nonafluorobutyl ether and methyl nonafluoroisobutyl ether (HFE-7100), isomer mixture of ethyl nonafluorobutyl ether and ethyl nonafluoroisobutyl ether (HFE-7200), 3-ethoxy-1, 1, 1, 2, 3, 4, 4, 5, 5, 6, 6, 6-dodecafluoro-2-trifluoromethyl-hexane (HFE-7500), 1, 1, 1, 2, 3, 3-hexafluoro-4-(1, 1, 2, 3, 3, 3-Hexafluoropropoxy)-pentane (HFE-7600), 1-methoxyheptafluoropropane (HFE-7000), 1, 1, 1, 2, 2, 3, 4, 5, 5, 5-decafluoro-3-methoxy-4-trifluoromethylpentane (HFE-7300), 1, 2-(1, 1, 2, 2-tetrafluoroethoxy) ethyl alkane (HFE-578E), 1, 1, 2, 2-tetrafluoroethyl-1H, 1H, 5H-octafluoropentyl ether (HFE-6512), 1, 1, 2, 2-tetrafluoroethyl-2, 2, 2-trifluoroethyl ether (HFE-347E), 1, 1, 2, 2-tetrafluoroethyl-2, 2, 3, 3-tetrafluoropropyl ether (HFE-458E), 2, 3, 3, 4, 4-pentafluorotetrahydro-5-methoxy-2, 5-bis[1, 2, 2, 2-tetrafluoro-1-(trifluoromethyl)ethyl]-furan (HFE-770), 1, 1, 1, 2, 2, 3, 3, 4, 4, 5, 5, 6, 6-tridecafluorooctane-propyl ether (TE6O—C3), $F(CF_2)_5OCH_3$, $F(CF_2)_6OCH_3$, $F(CF_2)_7OCH_3$, $F(CF_2)_8OCH_2CH_3$, $F(CF_2)_2O(CF_2)_4OCH_2CH_3$, $F(CF_2)_3OCF(CF_3)CF_2OCH_3$, $(CF_3)_2N(CF_2)_3OCH_3$, $(C_3F_7)_2N(CF_2)_3OC_3H_7$.

In one embodiment of the present disclosure, the third stripping solution is composed by a third fluorinated solvent.

It can be understood that, the first fluorinated high-molecular material and the second fluorinated high-molecular material may be the same or different, which is not particularly limited in the present disclosure.

Optionally, in step S340, as shown in FIG. 15, when the second removable base-material layer 821 is processed by a patterning operation by using the third stripping solution, a part of the second removable base-material layer 821 covered by the second mask layer 823 may be further removed. In other words, when the second removable base-material layer 821 is processed by a patterning operation by using the third stripping solution, the third stripping solution can continue to etch the second removable base-material layer 821 protected by the second mask layer 823 along an edge of the second mask layer 823, such that an orthographic projection of the second removable base layer 824 on the second mask layer 823 is within the second mask layer 823. That is, a cross section of the second pattern-defining layer 820 may be T-shaped, and the edge of the second mask layer 823 may not be supported by the second removable base layer 824. In this way, when the second electrode layer 600 is formed, as shown in FIG. 16, a second electrode-material layer 6010 may be formed on a side of the second pattern-defining layer 820 distal to the base substrate 100, and the second electrode-material layer 6010 is discontinuous at edges of the of the second pattern-defining layer 820, such that the second electrode-material layer 6010 is divided into a common electrode 620 corresponding to the pixel electrodes 320, fingerprint-recognition electrodes 610 connected with the transferring electrodes 310, and sacrificial electrodes 6011 located on a surface of the second pattern-defining layer 820, and the three kinds of electrodes are arranged in the same layer and isolated from each other. The common electrodes 620 and the fingerprint-recognition electrodes 610 form the second electrode layer 600 of the array substrate.

It can be understood that, in fabrication order, the second pattern-defining layer 820 may be fabricated after the organic light-emitting layer 500 is fabricated, but the second pattern-defining layer 820 is not necessarily located on a surface of the organic light-emitting layer 500. In one embodiment of the present disclosure, the second pattern-defining layer 820 is located on a surface of the organic light-emitting layer 500 distal to the base substrate 100. In this case, a part of the organic light-emitting layer 500 is located between the fingerprint-recognition electrodes 610 and the pixel-defining layer 400, but this part of the organic light-emitting layer 500 cannot form an electrical path to emit light, and will not influence on electrical connection between the fingerprint-recognition electrodes 610 and the transferring electrodes 310 either. In another embodiment of the present disclosure, a part of the second pattern-defining layer 820 is located on the surface of the organic light-emitting layer 500 distal to the base substrate 100, and another part of the second pattern-defining layer 820 is located on a surface of the pixel-defining layer 400 exposed by the organic light-emitting layer 500. In another embodiment of the present disclosure, the second pattern-defining layer 820 is located on the surface of the pixel-defining layer 400 exposed by the organic light-emitting layer 500.

In step S190, the second electrode layer 600 may be formed on the side of the second pattern-defining layer 820 distal to the base substrate 100, and the second electrode layer 600 includes the common electrode 620 and fingerprint-recognition electrodes 610 isolated by the second pattern-defining layer 820.

Optionally, the second electrode-material layer 6010 may be formed by evaporating metal material through an open mask. The second electrode-material layer 6010 includes the fingerprint-recognition electrodes 610 and the common electrode 620 isolated by the second pattern-defining layer 820, and includes the sacrificial electrodes 6011 located on the surface of the second pattern-defining layer 820 distal to the base substrate 100. In an embodiment of the present disclosure, the second electrode-material layer 6010 is a transparent electrode layer, such that both the common electrode 620 and the fingerprint-recognition electrodes 610 are transparent electrodes.

Figure 18:
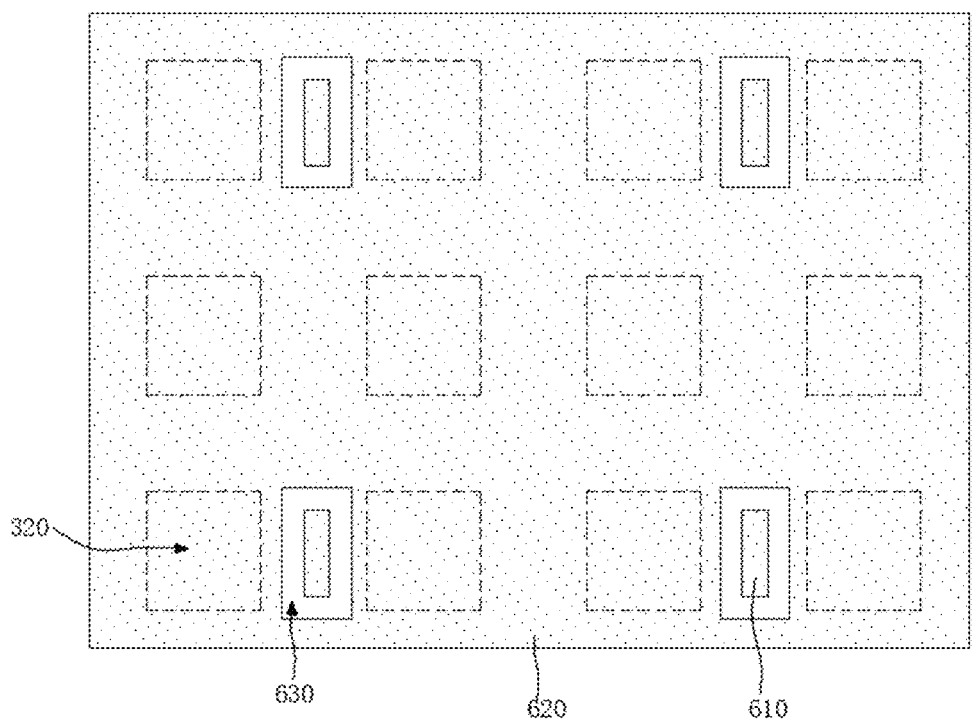
FIG. 18 is a schematic top-view structural diagram of a second electrode layer according to an embodiment of the present disclosure.

Optionally, the fabricating method of array substrate provided by the present disclosure may further include:

In step S1100, as shown in FIG. 17, the second pattern-defining layer 820 is removed. In this way, when the second pattern-defining layer 820 is removed, the sacrificial electrodes 6011 on the surface of the second pattern-defining layer 820 may be removed at the same time, thereby ensuring isolation of the common electrode 620 and the fingerprint-recognition electrodes 610. In this way, in the formed array substrate, as shown in FIG. 18, the second electrode layer 600 has a plurality of annular windows 630, and the annular windows 630 are used to isolate the common electrode 620 and the fingerprint-recognition electrodes 610.

Optionally, the second removable base layer 824 may be removed by using a fourth stripping solution, and then the second mask layer 823 and the sacrificial electrodes 6011 covering a surface of the second mask layer 823 may be removed. The fourth stripping solution contains a fourth fluorinated solvent. The fourth stripping solution can dissolve the second removable base layer 824 or make the second removable base layer 824 swell, but does not dissolve or corrode the organic light-emitting layer 500, nor dissolve or corrode the second electrode layer 600, then does not cause the organic light-emitting layer 500, the common electrode 620 and the fingerprint-recognition electrodes 610 to be damaged while removing the second pattern-defining layer 820, thereby ensuring light-emitting performance of the organic electroluminescent devices B and performance of the fingerprint-recognition sensor A.

The fourth fluorinated solvent may preferably be a hydrofluoroether compound, for example, may be selected from one or more of the following solvents: isomer mixture of methyl nonafluorobutyl ether and methyl nonafluoroisobutyl ether (HFE-7100), isomer mixture of ethyl nonafluorobutyl ether and ethyl nonafluoroisobutyl ether (HFE-7200), 3-ethoxy-1, 1, 1, 2, 3, 4, 4, 5, 5, 6, 6, 6-dodecafluoro-2-trifluoromethyl-hexane (HFE-7500), 1, 1, 1, 2, 3, 3-hexafluoro-4-(1, 1, 2, 3, 3, 3-Hexafluoropropoxy)-pentane (HFE-7600), 1-methoxyheptafluoropropane (HFE-7000), 1, 1, 1, 2, 2, 3, 4, 5, 5, 5-decafluoro-3-methoxy-4-trifluoromethylpentane (HFE-7300), 1, 2-(1, 1, 2, 2-tetrafluoroethoxy) ethyl alkane (HFE-578E), 1, 1, 2, 2-tetrafluoroethyl-1H, 1H, 5H-octafluoropentyl ether (HFE-6512), 1, 1, 2, 2-tetrafluoroethyl-2, 2, 2-trifluoroethyl ether (HFE-347E), 1, 1, 2, 2-tetrafluoroethyl-2, 2, 3, 3-tetrafluoropropyl ether (HFE-458E), 2, 3, 3, 4, 4-pentafluorotetrahydro-5-methoxy-2, 5-bis[1, 2, 2, 2-tetrafluoro-1-(trifluoromethyl)ethyl]-furan (HFE-770), 1, 1, 1, 2, 2, 3, 3, 4, 4, 5, 5, 6, 6-tridecafluorooctane-propyl ether (TE6O—C3), $F(CF_2)_5OCH_3$, $F(CF_2)_6OCH_3$, $F(CF_2)_7OCH_3$, $F(CF_2)_8OCH_2CH_3$, $F(CF_2)_2O(CF_2)_4OCH_2CH_3$, $F(CF_2)_3OCF(CF_3)CF_2OCH_3$, $(CF_3)_2N(CF_2)_3OCH_3$, $(C_3F_7)_2N(CF_2)_3OC_3H_7$.

In one embodiment of the present disclosure, the fourth stripping solution is composed by a fourth fluorinated solvent.

It can be understood that any two of the first stripping solution, the second stripping solution, the third stripping solution and the fourth stripping solution may be the same or different, which is not limited in the present disclosure.

Figure 19:
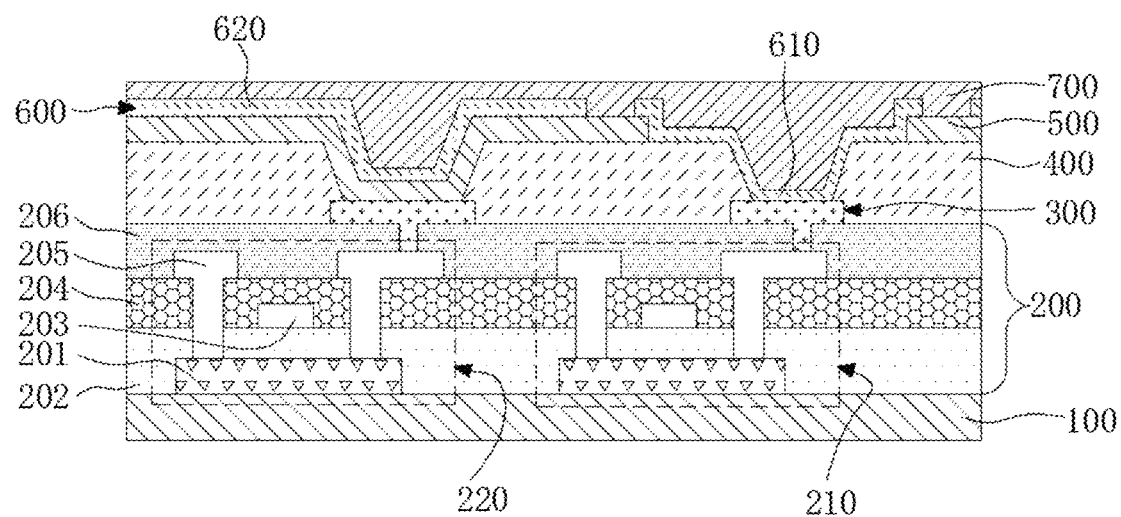
FIG. 19 is a schematic structural diagram of forming a thin-film-encapsulation layer according to an embodiment of the present disclosure.

Optionally, as shown in FIG. 19, the fabricating method of array substrate provided by the present disclosure may further include:

In step S1110, as shown in FIG. 19, a thin-film-encapsulation layer 700 is formed on a surface of the second electrode layer 600 distal to the base substrate 100, and the thin-film-encapsulation layer 700 covers the common electrode 620 and the fingerprint-recognition electrodes 610. In this way, the thin-film-encapsulation layer 700 of array substrate of the present disclosure does not need to be punched, which can ensure encapsulation effect of the organic light-emitting layer 500.

The present disclosure further provides an array substrate, as shown in FIG. 19, the array substrate includes the base substrate 100, the driving-circuit layer 200, the first electrode layer 300, the pixel-defining layer 400, the organic light-emitting layer 500 and the second electrode layer 600.

The driving-circuit layer 200 is arranged on one side of the base substrate 100, and includes the first driving circuits 210 and the second driving circuits 220. The first electrode layer 300 is arranged at the side of the driving-circuit layer 200 distal to the base substrate 100, and includes and the transferring electrodes 310 electrically connected to the first driving circuits 210, and the pixel electrodes 320 electrically connected to the second driving circuits 220. The pixel-defining layer 400 is disposed on the side of the first electrode layer 300 distal to the base substrate 100, and the pixel-defining layer 400 is provided with pixel opens 420 exposing at least a part of the pixel electrodes 320, and connecting via holes 410 exposing at least a part of the transferring electrodes 310. The organic light-emitting layer 500 is disposed on the side of the pixel-defining layer 400 distal to the base substrate 100, and the organic light-emitting layer 500 covers a part of the pixel electrodes 320 exposed by the pixel-defining layer 400, but exposes the connecting via holes 410. The second electrode layer 600 is disposed on the side of the organic light-emitting layer 500 distal to the base substrate 100, and includes a common electrode 620 and fingerprint-recognition electrodes 610 that are insulated from each other, wherein an orthographic projection of the common electrode 620 on the first electrode layer 300 covers a part of the pixel electrodes 320 exposed by the pixel-defining layer 400, and the fingerprint-recognition electrodes 610 cover the connecting via holes 410.

The array substrate provided by the present disclosure may be fabricated by any one of the fabricating methods of array substrate described in the above-mentioned embodiments of fabricating methods of array substrate. The beneficial effects and other details of the array substrate have been described in the above-mentioned embodiments of fabricating methods of array substrate in detail, or can be clearly deduced from the description of the above-mentioned embodiments of fabricating methods of array substrate, and the present disclosure will not repeat it here.

In some embodiments, the array substrate of the present disclosure may further include a light-extracting layer on the side of the second electrode layer distal to the base substrate, so as to enhance light-extracting efficiency of organic light-emitting diodes.

Optionally, the array substrate may further include a thin-film-encapsulation layer. The thin-film encapsulation layer is disposed on the surface of the second electrode layer distal to the base substrate, and may include alternately-stacked inorganic encapsulation layers and organic encapsulation layers. The inorganic encapsulation layers can effectively block moisture and oxygen from outside, and prevent water and oxygen from invading the organic light-emitting layer and causing material to degrade. Optionally, Edges of the inorganic encapsulation layers may be located in a peripheral region of array substrate. The organic encapsulation layer is located between two adjacent inorganic encapsulation layers in order to achieve planarization and reduce stress between the inorganic encapsulation layers. Edges of the organic encapsulation layer may be located between the display area of array substrate and the edge of the inorganic encapsulation layer. Exemplarily, the thinfilm-encapsulation layer includes a first inorganic encapsulation layer, an organic encapsulation layer and a second inorganic encapsulation layer that are laminated in sequence on the side of the second electrode layer distal to the base substrate.

In some embodiments, the display panel may further include a touch-function layer, and the touch function layer is disposed on a side of the thin-film-encapsulation layer distal to the base substrate, for realizing touch operation of the display panel. In some other embodiments, the finger-print-recognition electrodes can be multiplexed as touch electrodes, which can be used to implement touch control in response to signals generated by fingers or external touch objects.

Optionally, the display panel may further include an anti-reflection layer, and the anti-reflection layer may be disposed on the side of the thin-film encapsulation layer distal to the base substrate, for reducing reflection of ambient light by the array substrate, thereby reducing influence of the ambient light on display effect. In an embodiment of the present disclosure, the anti-reflection layer may include a color filter layer and a black matrix layer that are stacked to each other, such that reduction of light transmittance of array substrate can be avoided while reducing interference of ambient light. In another embodiment of the present disclosure, the anti-reflection layer may be a polarizer, for example, a patterned coated circular polarizer. Further, the anti-reflection layer may be disposed on a side of the touch-function layer distal to the base substrate.

In some embodiments, the array substrate may further be provided with a quantum-dot light-emitting layer on the side of the second electrode layer distal to the base substrate, and the quantum-dot light-emitting layer can realize photoluminescence. In this way, the organic electroluminescent diode can be used as light source of the quantum-dot light-emitting layer, which makes the array substrate can be a QD-OLED array substrate.

The present disclosure further provides a display panel, which includes any one of the array substrates described in the foregoing array-substrate embodiments. In one embodiment of the present disclosure, the array substrate provided by the present disclosure may be directly used as the display panel of the present disclosure.

Embodiments of the present disclosure further provide a display device, which includes any of the array substrates described in the foregoing array-substrate embodiments. The display device may be a mobile-phone screen, a notebook-computer screen, a tablet computer or other types of display devices. Since the display device has any of the array substrates described in the above-mentioned array-substrate embodiments, it has the same beneficial effects of the above-mentioned array substrate, and details are not described here in the present disclosure.

It should be understood that the present disclosure does not limit its application to the detailed structure and arrangement of components set forth in this specification. The present disclosure may have other embodiments and be implemented and carried out in various ways, and variations and modifications fall within the scope of the present disclosure. It will be understood that the disclosure disclosed and defined in this specification extends to all alternative combinations of two or more individual features mentioned or evident in the text and/or drawings. All of these different combinations constitute various alternative aspects of the present disclosure. The embodiments of this specification illustrate the best mode known for carrying out the disclosure, and will enable those skilled in the art to utilize the disclosure.

What is claimed is:

1. A method for fabricating an array substrate, comprising:

providing a base substrate;

forming a driving-circuit layer on a side of the base substrate, wherein the driving-circuit layer comprises first driving circuits and second driving circuits;

forming a first electrode layer on a side of the driving-circuit layer distal to the base substrate, wherein the first electrode layer comprises transferring electrodes electrically connected to the first driving circuits, and pixel electrodes electrically connected to the second driving-circuits;

forming a pixel-defining layer on a side of the first electrode layer distal to the base substrate, wherein the pixel-defining layer is provided with pixel openings and connecting via holes, the pixel opening exposes at least a part of the pixel electrode, and the connecting via hole exposes at least a part of the transferring electrode;

forming a first pattern-defining layer on a side of the pixel-defining layer distal to the base substrate, wherein the first pattern-defining layer covers the connecting via holes and exposes the pixel openings;

forming an organic light-emitting-material layer on a side of the first pattern-defining layer distal to the base substrate, wherein the organic light-emitting-material layer covers the pixel openings and the first pattern-defining layer;

removing the first pattern-defining layer, such that the organic light-emitting-material layer forms an organic light-emitting layer;

forming a second pattern-defining layer surrounding the connecting via holes on the side of the pixel-defining layer distal to the base substrate; and forming a second electrode layer on a side of the second pattern-defining layer distal to the base substrate, wherein the second electrode layer comprises a common electrode and fingerprint-recognition electrodes isolated by the second pattern-defining layer.

2. The method for fabricating an array substrate according to claim 1, wherein forming the first pattern-defining layer on the side of the pixel-defining layer distal to the base substrate comprises:

forming a first removable base-material layer on the side of the pixel-defining layer distal to the base substrate;

forming a first photoresist-material layer on a side of the first removable base-material layer distal to the base substrate;

patterning the first photoresist-material layer, to form a first mask layer, wherein orthographic projections of the connecting via holes on the first mask layer are located within the first mask layer; and by using the first mask layer as a mask, patterning the first removable base-material layer, to form a first removable base layer, wherein the first removable base layer and the first mask layer constitute the first pattern-defining layer.

3. The method for fabricating an array substrate according to claim 2, wherein forming the first removable base-material layer on the side of the pixel-defining layer distal to the base substrate comprises:

by using a first base material, forming the first removable base-material layer on the side of the pixel-defining layer distal to the base substrate, wherein the first base material comprises a first fluorinated high-molecular material; and patterning the first removable base-material layer to form the first removable base layer comprises:

patterning the first removable base-material layer by using a first stripping solution, to remove a part of the first removable base-material layer not covered by the first mask layer, wherein the first stripping solution contains a first fluorinated solvent.

4. The method for fabricating an array substrate according to claim 3, wherein patterning the first removable base-material layer to form the first removable base layer further comprises:

in response to patterning the first removable base-material layer by using the first stripping solution, removing a part of the first removable base-material layer covered by the first mask layer.

5. The method for fabricating an array substrate according to claim 3, wherein removing the first pattern-defining layer comprises:

removing the first removable base layer by using a second stripping solution, to remove the first mask layer, wherein the second stripping solution comprises a second fluorinated solvent.

6. The method for fabricating an array substrate according to claim 1, wherein forming the second pattern-defining layer surrounding the connecting via holes on the side of the pixel-defining layer distal to the base substrate comprises:

forming a second removable base-material layer on a side of the organic light-emitting layer distal to the base substrate;

forming a second photoresist-material layer on a side of the second removable base-material layer distal to the base substrate;

patterning the second photoresist-material layer, to form a second mask layer, wherein an orthographic projection of the second mask layer on the pixel-defining layer surrounds the connecting via holes; and by using the second mask layer as a mask, patterning the second removable base-material layer, to form a second removable base layer, wherein the second removable base layer and the second mask layer constitute the second pattern-defining layer.

7. The method for fabricating an array substrate according to claim 6, wherein forming the second removable base-material layer on the side of the organic light-emitting layer distal to the base substrate comprises:

by using a second base material, forming the second removable base-material layer on the side of the organic light-emitting layer distal to the base substrate, wherein the second base material comprises a second fluorinated high-molecular material; and patterning the second removable base-material layer to form the second removable base layer comprises:

patterning the second removable base-material layer by using a third stripping solution, to remove a part of the second removable base-material layer not covered by the second mask layer, wherein the third stripping solution contains a third fluorinated solvent.

8. The method for fabricating an array substrate according to claim 7, wherein patterning the second removable base-material layer to form the second removable base layer further comprises:

in response to patterning the second removable base-material layer by using the third stripping solution, removing a part of the second removable base-material layer covered by the second mask layer.

9. The method for fabricating an array substrate according to claim 1, further comprising:

removing the second pattern-defining layer.

10. An array substrate, comprising:

a base substrate;

a driving-circuit layer, disposed on a side of the base substrate, and comprising first driving circuits and second driving circuits;

a first electrode layer, disposed on a side of the driving-circuit layer distal to the base substrate, and comprising transferring electrodes electrically connected to the first driving circuits, and pixel electrodes electrically connected to the second driving-circuits;

a pixel-defining layer, disposed on a side of the first electrode layer distal to the base substrate, wherein the pixel-defining layer is provided with pixel windows and connecting via holes, the pixel opening exposes at least a part of the pixel electrode, and the connecting via hole exposes at least a part of the transferring electrode;

an organic light-emitting layer, disposed on a side of the pixel-defining layer distal to the base substrate, wherein the organic light-emitting layer covers a part of the pixel electrodes exposed by the pixel-defining layer, and exposes the connecting via holes; and a second electrode layer, disposed on a side of the organic light-emitting layer distal to the base substrate, and comprising a common electrode and fingerprint-recognition electrodes that are insulated from each other, wherein an orthographic projection of the common electrode on the first electrode layer covers a part of the pixel electrodes exposed by the pixel-defining layer, and the fingerprint-recognition electrodes cover the connecting via holes.

11. A display device, comprising the array substrate according to claim 10.

* * * * *